US010998325B2

(12) United States Patent
Decobert et al.

(10) Patent No.: US 10,998,325 B2
(45) Date of Patent: May 4, 2021

(54) MEMORY CELL WITH FLOATING GATE, COUPLING GATE AND ERASE GATE, AND METHOD OF MAKING SAME

(71) Applicant: Silicon Storage Technology, Inc., San Jose, CA (US)

(72) Inventors: Catherine Decobert, Pourrieres (FR); Hieu Van Tran, San Jose, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 164 days.

(21) Appl. No.: 16/208,297

(22) Filed: Dec. 3, 2018

(65) Prior Publication Data
US 2020/0176460 A1    Jun. 4, 2020

(51) Int. Cl.
| | |
|---|---|
| *G11C 16/16* | (2006.01) |
| *H01L 27/11521* | (2017.01) |
| *G11C 16/26* | (2006.01) |
| *H01L 29/08* | (2006.01) |
| *H01L 29/10* | (2006.01) |
| *H01L 29/423* | (2006.01) |

(52) U.S. Cl.
CPC ........ *H01L 27/11521* (2013.01); *G11C 16/16* (2013.01); *G11C 16/26* (2013.01); *H01L 29/0847* (2013.01); *H01L 29/1033* (2013.01); *H01L 29/42328* (2013.01)

(58) Field of Classification Search
CPC ...... G11C 16/16; G11C 16/26; G11C 11/5621
See application file for complete search history.

(56) References Cited

U.S. PATENT DOCUMENTS

| | | | |
|---|---|---|---|
| 5,029,130 A | 7/1991 | Yeh | |
| 6,855,980 B2 | 2/2005 | Wang et al. | |
| 6,901,006 B1* | 5/2005 | Kobayashi | G11C 16/0416 257/314 |
| 6,963,102 B2* | 11/2005 | Mori | H01L 29/42324 257/315 |
| 7,315,056 B2 | 1/2008 | Klinger et al. | |
| 7,927,994 B1 | 4/2011 | Liu et al. | |
| 8,780,625 B2 | 7/2014 | Gu et al. | |

(Continued)

FOREIGN PATENT DOCUMENTS

| | | |
|---|---|---|
| WO | 2016118532 | 7/2016 |
| WO | 2016118785 | 7/2016 |
| WO | 2017 200709 | 11/2017 |

*Primary Examiner* — Han Yang
(74) *Attorney, Agent, or Firm* — DLA Piper LLP (US)

(57) ABSTRACT

A memory device that includes source and drain regions formed in a semiconductor substrate, with a first channel region of the substrate extending there between. A floating gate is disposed over and insulated from the channel region, wherein the conductivity of the channel region is solely controlled by the floating gate. A control gate is disposed over and insulated from the floating gate. An erase gate is disposed over and insulated from the source region, wherein the erase gate includes a notch that faces and is insulated from an edge of the floating gate. Logic devices are formed on the same substrate. Each logic device has source and drain regions with a channel region extending there between, and a logic gate disposed over and controlling the logic device's channel region.

6 Claims, 29 Drawing Sheets

(56) References Cited

U.S. PATENT DOCUMENTS

2002/0191458 A1* 12/2002 Kobayashi ......... G11C 16/0425
365/200
2014/0050025 A1   2/2014  Tsao et al.
2017/0062446 A1   3/2017  Kodama
2017/0125429 A1   5/2017  Su et al.
2019/0189214 A1* 6/2019  Tiwari ............... G11C 16/0483

* cited by examiner

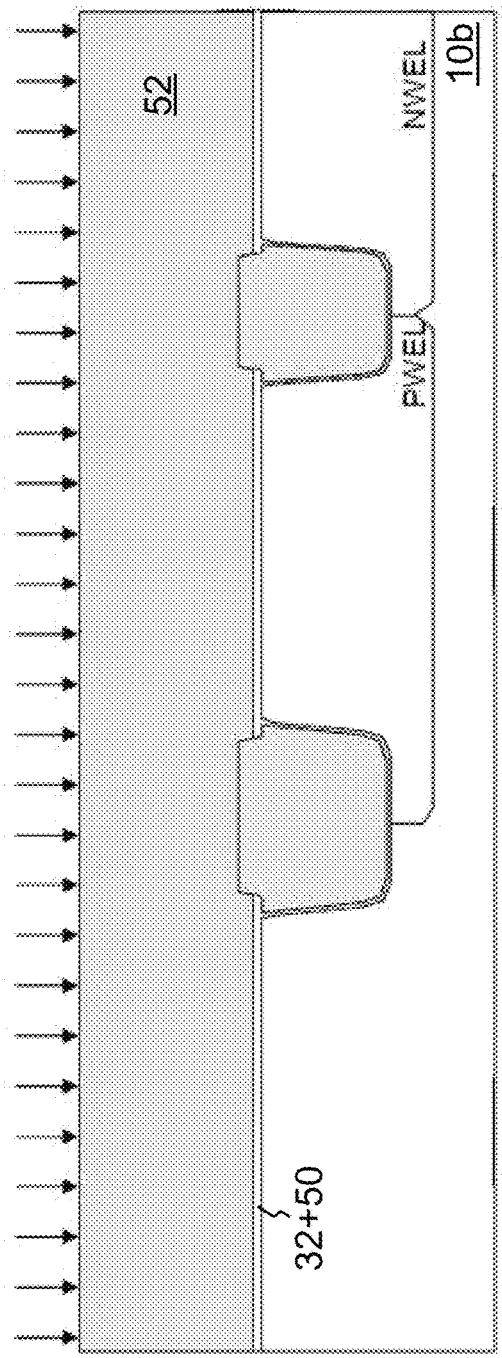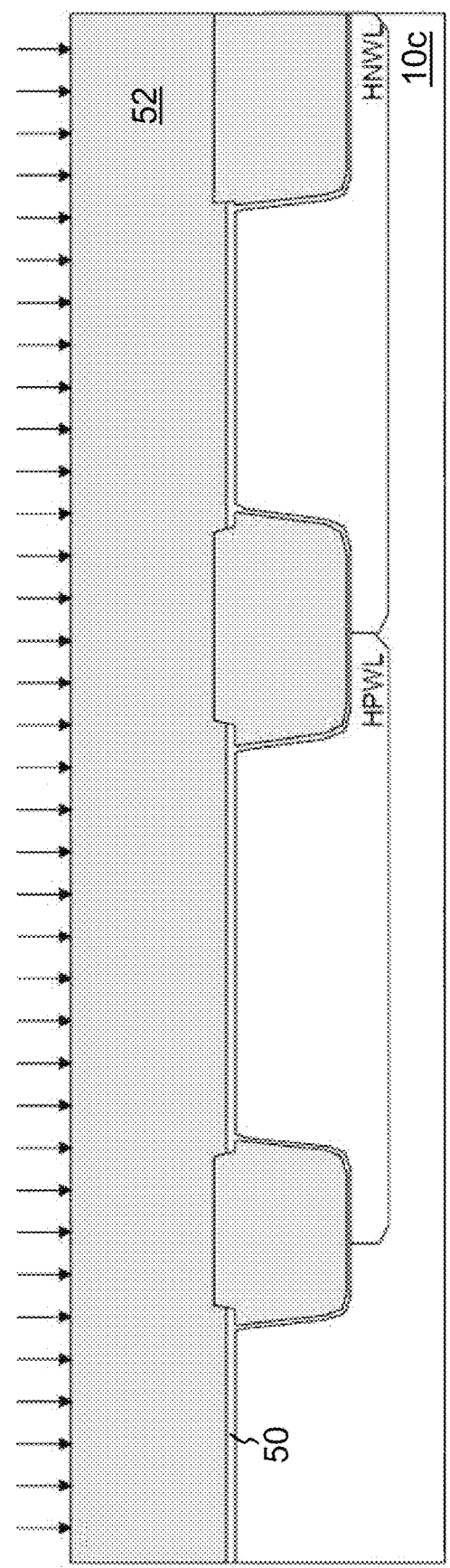

|  | BL (sel) | BL (uns) | CGL (sel) | CGL (uns) | EGL (sel) | EGL (uns) | SL (sel) | SL (uns) |
|---|---|---|---|---|---|---|---|---|
| Erase Pre-program | 0V | 3-4V | 8-10V | 0V | 0/3-4V | 0V | 3-4V | 0V |
| Erase | 0V | 0V | 0V | 0V | 12V | 0V | 0V | 0V |
| Erase Soft-program | 0V | 3-4V | 4-5V | 0V | 0/3-4V | 0V | 3-4V | -0.5V |
| Program | 0V | 3-4V | 8-10V | 0V | 0/3-4V | 0V | 3-4V | -0.5V |
| Read | ~1V | 0V | 2.5~5V | 0V | 2.5~5V | 0V | 0V | 0V |

FIGURE 17

|  | BL (sel) | BL (uns) | CG (sel) | CG (uns) | EG (sel) | EG (uns) | SL (sel) | SL (uns) |
|---|---|---|---|---|---|---|---|---|
| Erase Pre-program | 0V | 3-4V | 8-10V | -3V | 0V | 0V | 3-4V | -0.5V |
| Erase | 0V | 0V | -8 | 0V | 8V | 0V | 0V | 0V |
| Erase Soft-program | 0V | 3-4V | 4-5V | 0V | 0/3-4V | 0V | 3-4V | -0.5V |
| Program | 0V | 3-4V | 8-10V | -3V | 0V | 0V | 3-4V | -0.5V |
| Read | ~1V | 0V | 2.5~5V | 0V | 2.5~5V | 0V | 0V | 0V |

FIGURE 18

MEMORY CELL WITH FLOATING GATE, COUPLING GATE AND ERASE GATE, AND METHOD OF MAKING SAME

FIELD OF THE INVENTION

The present invention relates to non-volatile flash memory devices, and more particularly to an array of flash memory embedded on the same chip as core and high voltage logic devices.

BACKGROUND OF THE INVENTION

Split gate non-volatile memory devices are well known in the art. For example, U.S. Pat. No. 7,927,994, incorporated herein by reference, discloses a split gate non-volatile memory cell, where two different portions of the channel region are controlled by two different gates (a floating gate and a select gate). The memory cell additionally includes a control gate over the floating gate, and an erase gate over the source region. The split gate memory cell is advantageous because operating voltages are relatively low, which means on board power supplies can be smaller and more efficient. The split gate memory cell is disadvantageous because the memory cell size is enlarged to accommodate two separate gates laterally displaced to control the two separate portions of the channel region.

Stacked gate non-volatile memory device, where only a single gate (floating gate) controls the channel region, are well known in the art. A control gate is formed over the floating gate. The stacked gate memory cell is advantageous because the memory cell can be scaled down to smaller sizes given that only a single gate is used to control the channel region. The stacked gate memory cell is disadvantageous because operating voltages are relatively high.

There is a need for a memory cell design that can be scaled down to smaller sizes, yet operates using relatively low voltages. There is also a need for a method of making such memory cells on the same chip as other logic devices, such as low voltage logic devices (core devices) and higher voltage logic devices (HV devices).

BRIEF SUMMARY OF THE INVENTION

The aforementioned problems and needs are addressed by a memory device that includes a semiconductor substrate, a first source region and a first drain region formed in the substrate, with a first channel region of the substrate extending there between, a floating gate disposed over and insulated from the first channel region, wherein a conductivity of the first channel region is solely controlled by the floating gate, a control gate disposed over and insulated from the floating gate, and an erase gate disposed over and insulated from the source region, wherein the erase gate includes a notch that faces and is insulated from an edge of the floating gate.

A memory device includes a semiconductor substrate, a first source region formed in the substrate, first and second drain regions formed in the substrate, wherein a first channel region of the substrate extends between the first drain region and the first source region, and wherein a second channel region of the substrate extends between the second drain region and the first source region, a first floating gate disposed over and insulated from the first channel region, wherein a conductivity of the first channel region is solely controlled by the first floating gate, a second floating gate disposed over and insulated from the second channel region, wherein a conductivity of the second channel region is solely controlled by the second floating gate, a first control gate disposed over and insulated from the first floating gate, a second control gate disposed over and insulated from the second floating gate, and an erase gate disposed over and insulated from the first source region, wherein the erase gate includes a first notch that faces and is insulated from an edge of the first floating gate and a second notch that faces and is insulated from an edge of the second floating gate.

A method of forming a memory device includes forming a first source region and a first drain region in a semiconductor substrate, with a first channel region of the substrate extending there between, forming a floating gate over and insulated from the first channel region, wherein a conductivity of the first channel region is solely controlled by the floating gate, forming a control gate over and insulated from the floating gate, and forming an erase gate over and insulated from the source region, wherein the erase gate includes a notch that faces and is insulated from an edge of the floating gate.

A method of forming memory device includes forming a first source region in a semiconductor substrate, forming first and second drain regions in the substrate, wherein a first channel region of the substrate extends between the first drain region and the first source region, and wherein a second channel region of the substrate extends between the second drain region and the first source region, forming a first floating gate over and insulated from the first channel region, wherein a conductivity of the first channel region is solely controlled by the first floating gate, forming a second floating gate over and insulated from the second channel region, wherein a conductivity of the second channel region is solely controlled by the second floating gate, forming a first control gate over and insulated from the first floating gate; forming a second control gate over and insulated from the second floating gate, and forming an erase gate over and insulated from the first source region, wherein the erase gate includes a first notch that faces and is insulated from an edge of the first floating gate and a second notch that faces and is insulated from an edge of the second floating gate.

A method of operating a memory cell that includes a semiconductor substrate, a source region and a drain region formed in the substrate, with a channel region of the substrate extending there between, a floating gate disposed over and insulated from the channel region, wherein a conductivity of the channel region is solely controlled by the floating gate, a control gate disposed over and insulated from the floating gate, and an erase gate disposed over and insulated from the source region, wherein the erase gate includes a notch that faces and is insulated from an edge of the floating gate. The method includes removing electrons from the floating gate by applying a positive voltage to the erase gate.

Other objects and features of the present invention will become apparent by a review of the specification, claims and appended figures.

BRIEF DESCRIPTION OF THE DRAWINGS

FIGS. 2A-13A are side cross sectional views of the memory array area portion of the substrate (in the word line (WL) direction), illustrating the steps of forming the memory cells.

FIGS. 2B-13B are side cross sectional views of the memory array area portion of the substrate (in the bit line (BL) direction), illustrating the steps of forming the memory cells.

FIGS. 2C-13C are cross sectional views of the core device area portion of the substrate, illustrating the steps of forming the core devices.

FIGS. 2D-13D are cross sectional views of the HV device area portion of the substrate, illustrating the steps of forming the HV devices.

FIGS. 17-18 are tables of exemplary operational voltages for the memory cells formed in the memory array area of the substrate.

DETAILED DESCRIPTION OF THE INVENTION

Figure 1:
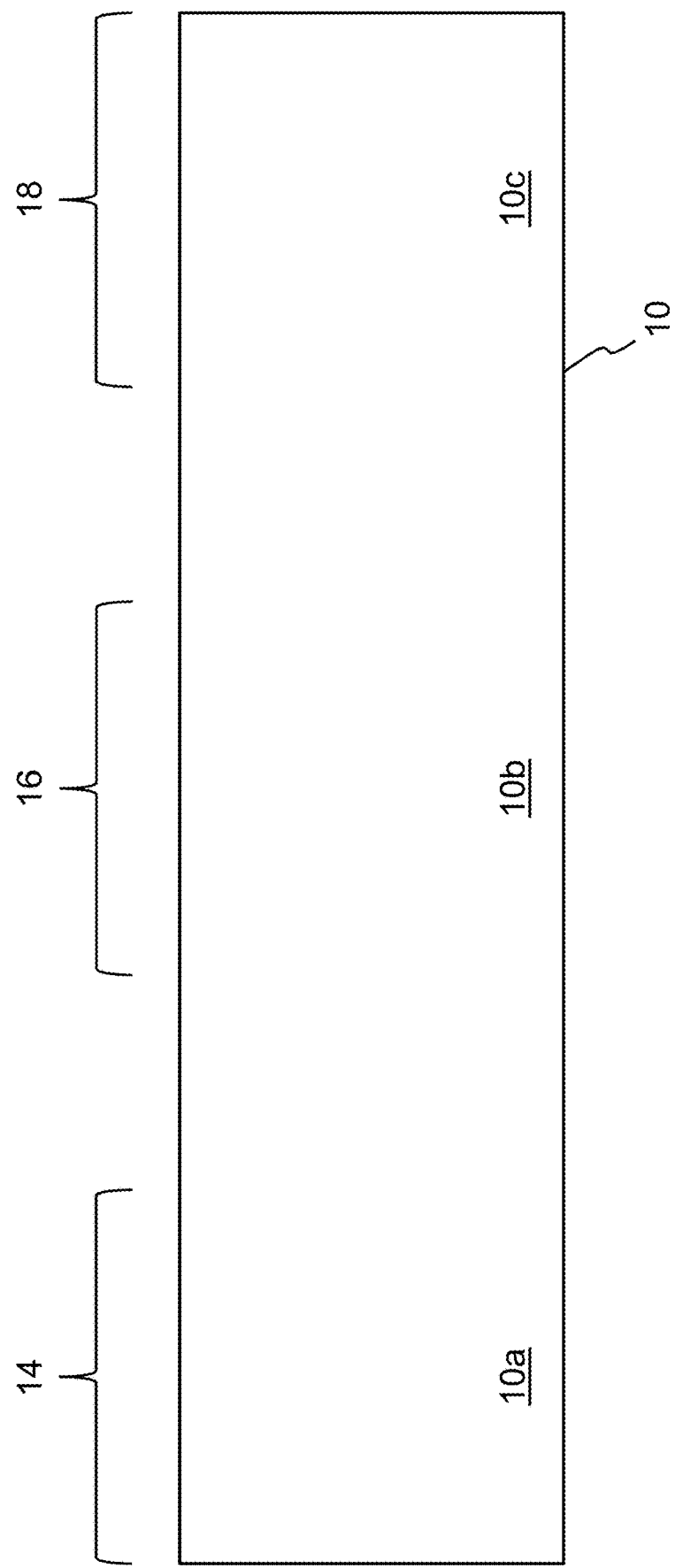
FIG. 1 is a side cross sectional view of the memory array, core device and HV device areas of the substrate.
Figure 2A:
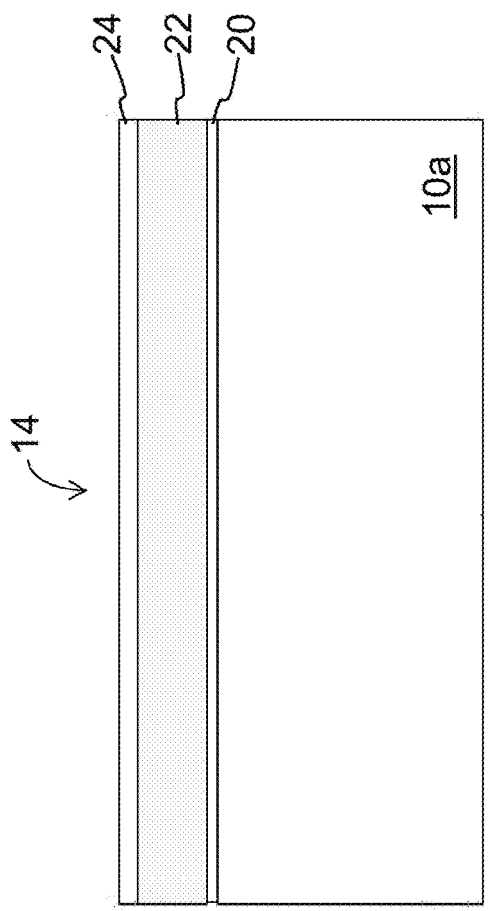
Figure 2B:
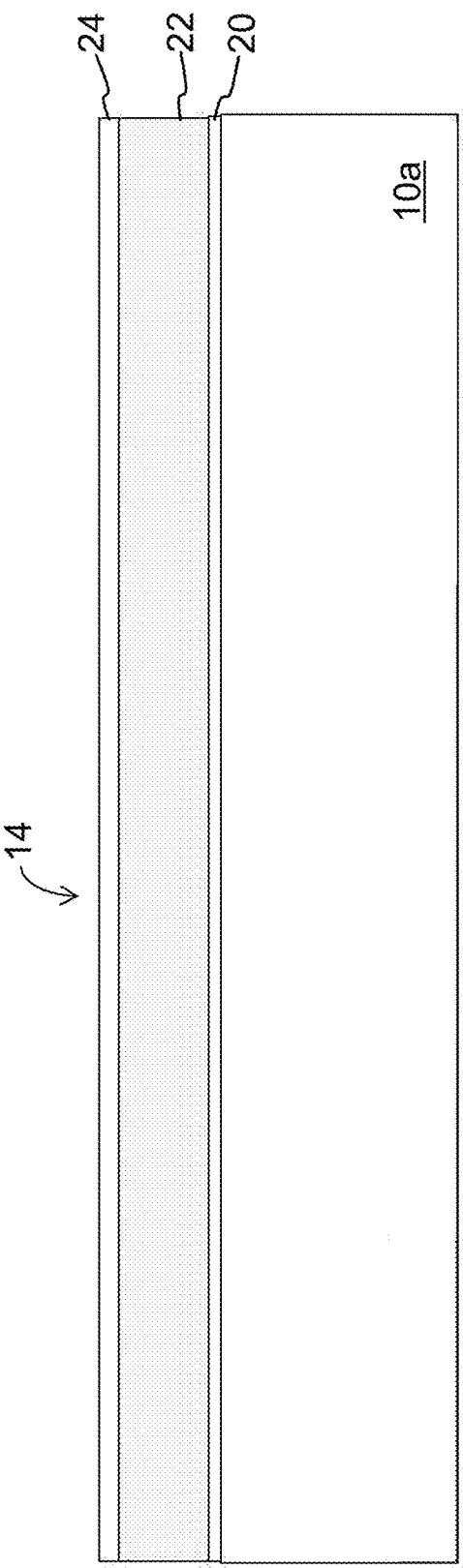
Figure 2C:
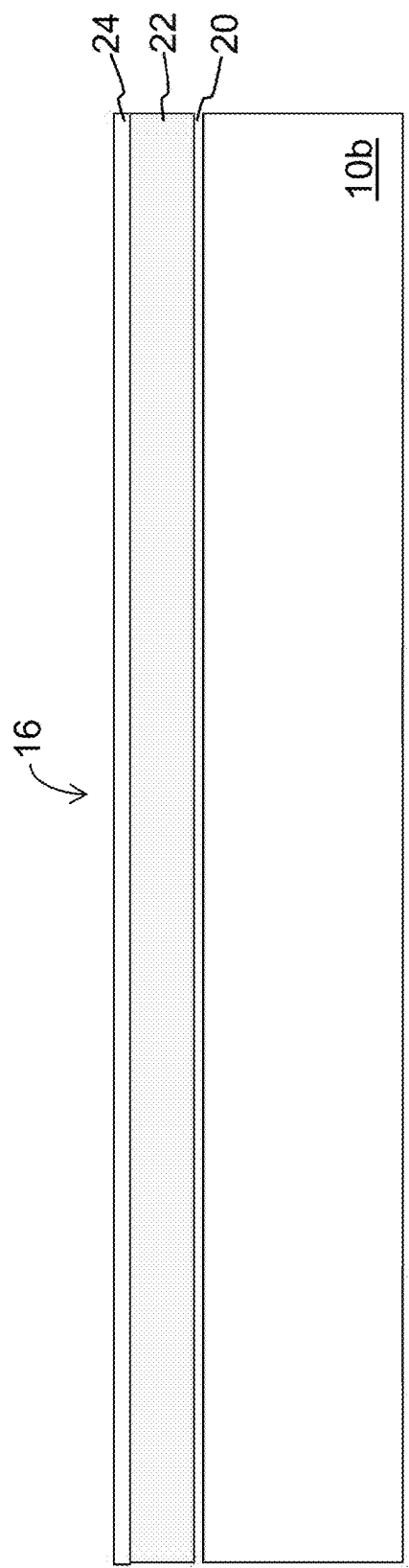
Figure 2D:
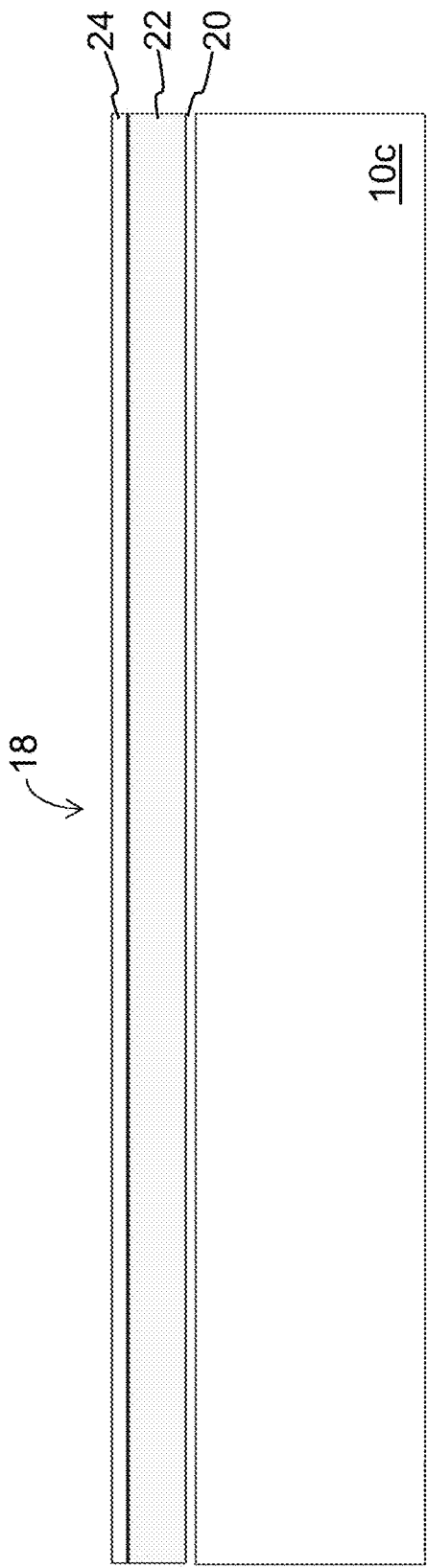
Figure 3A:
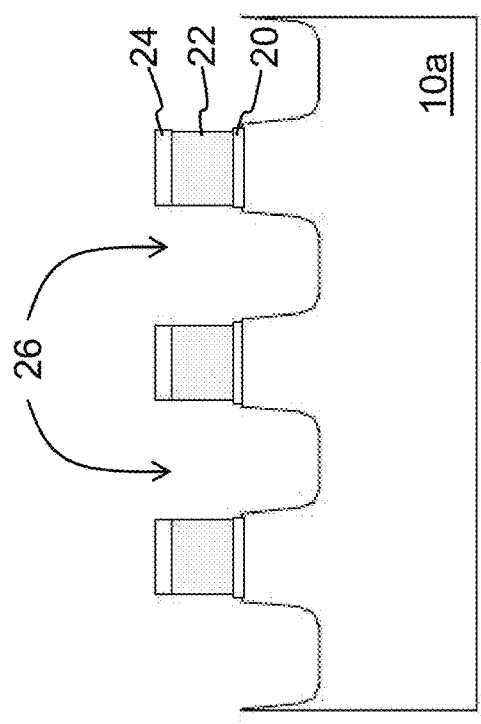
Figure 3B:
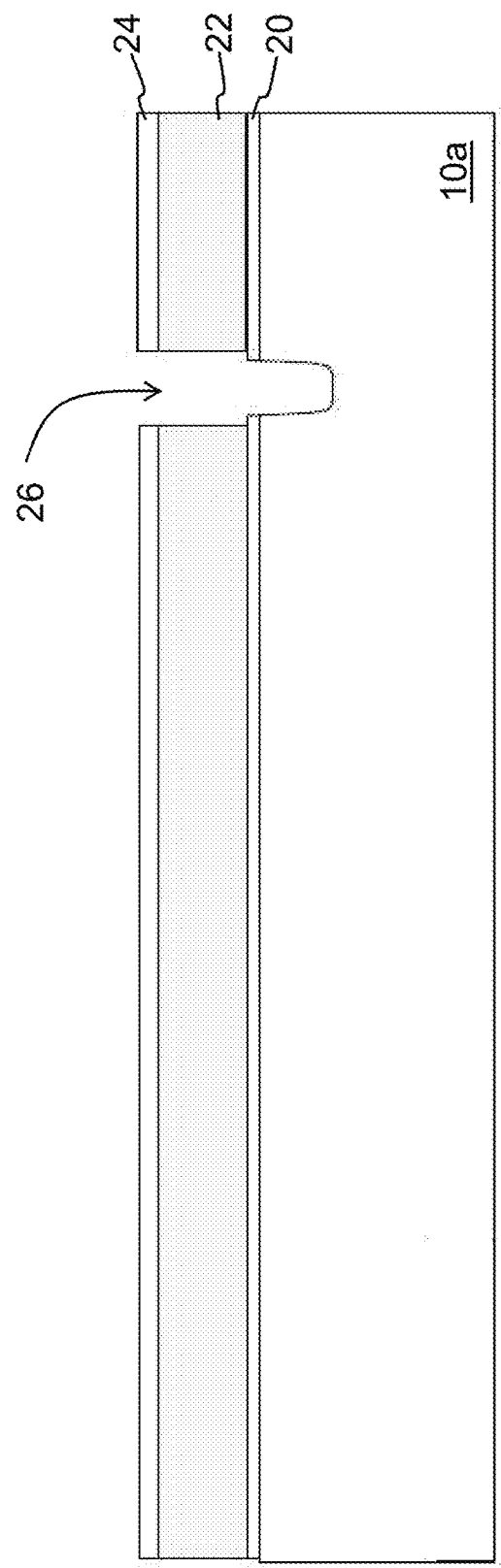
Figure 3C:
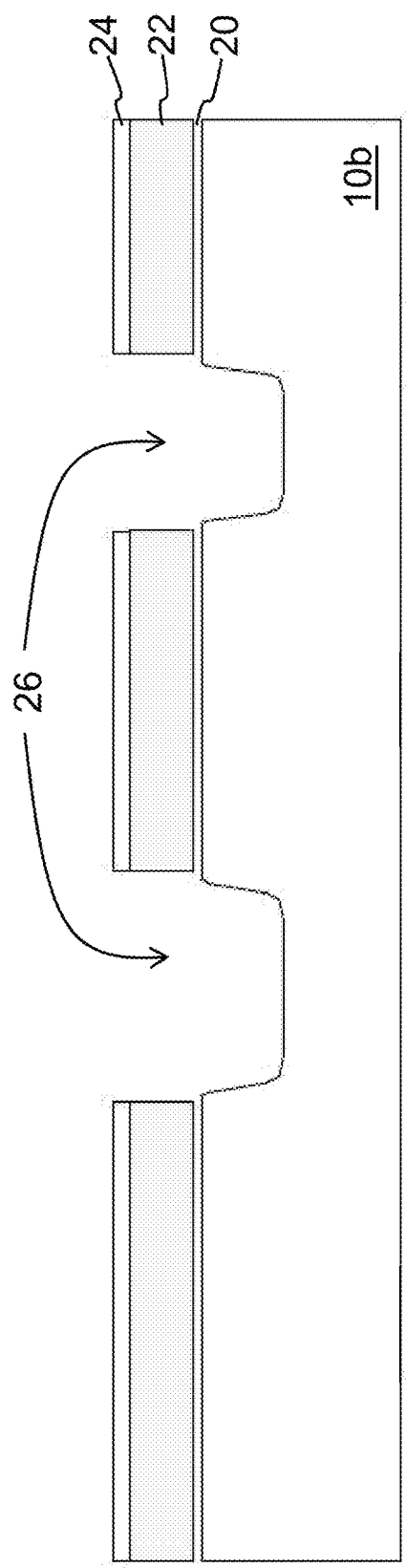
Figure 3D:
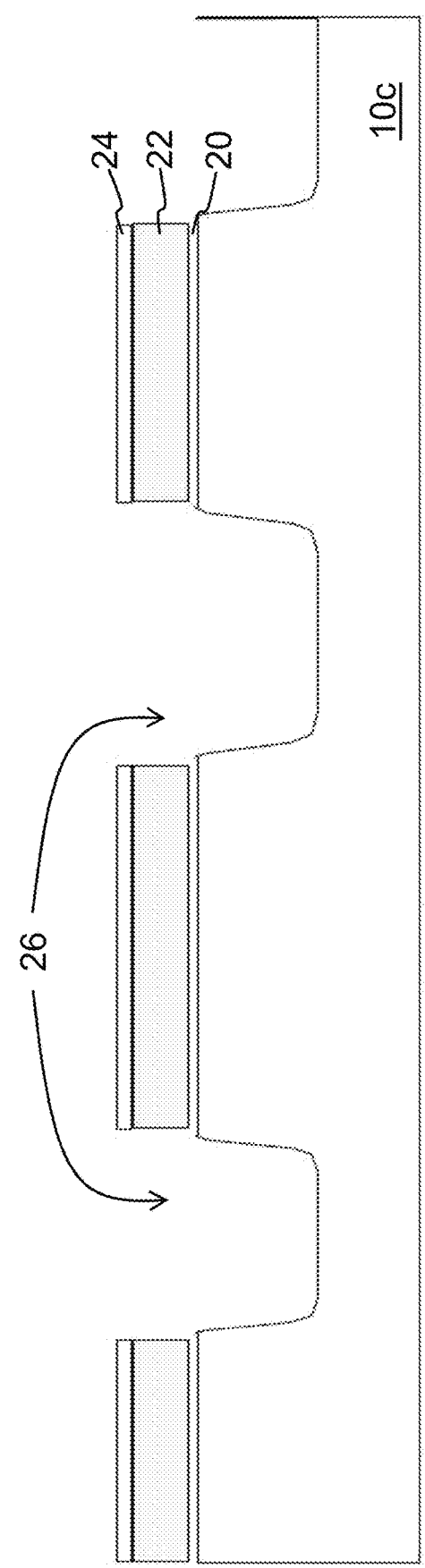
Figure 4A:
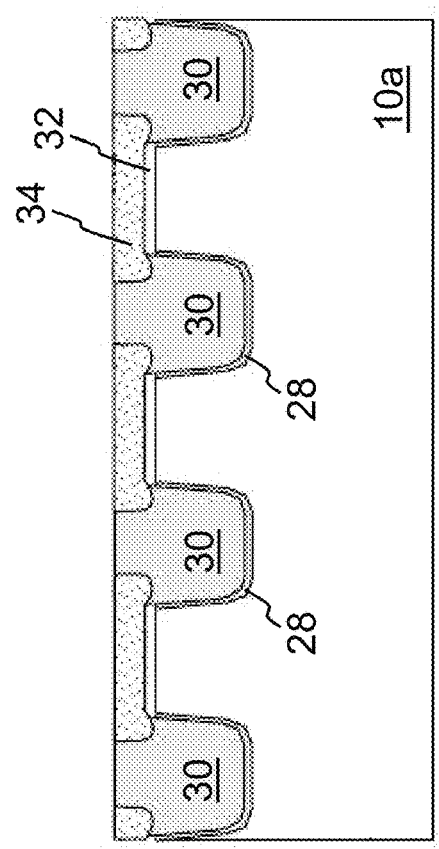
Figure 4B:
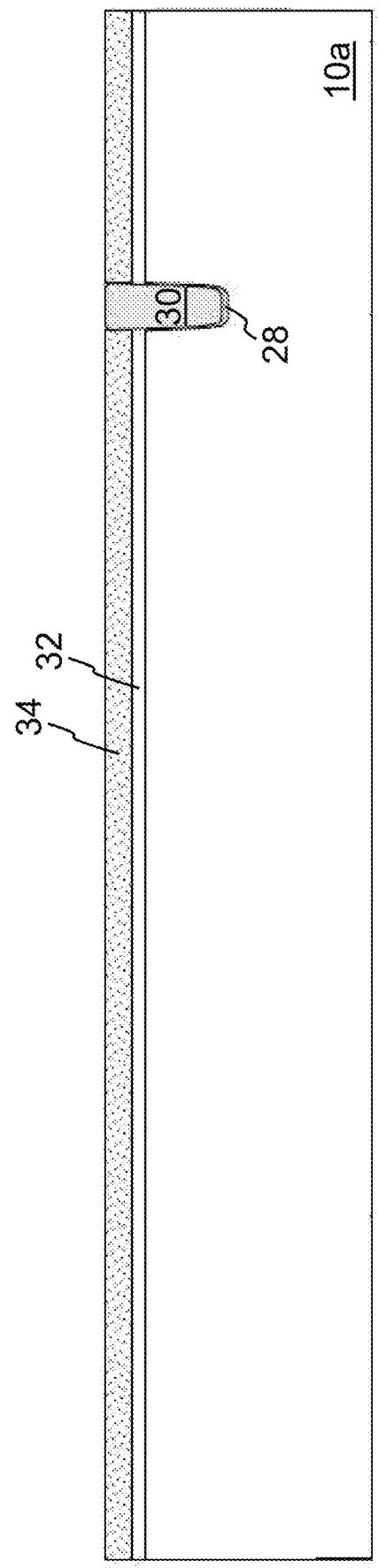
Figure 4C:
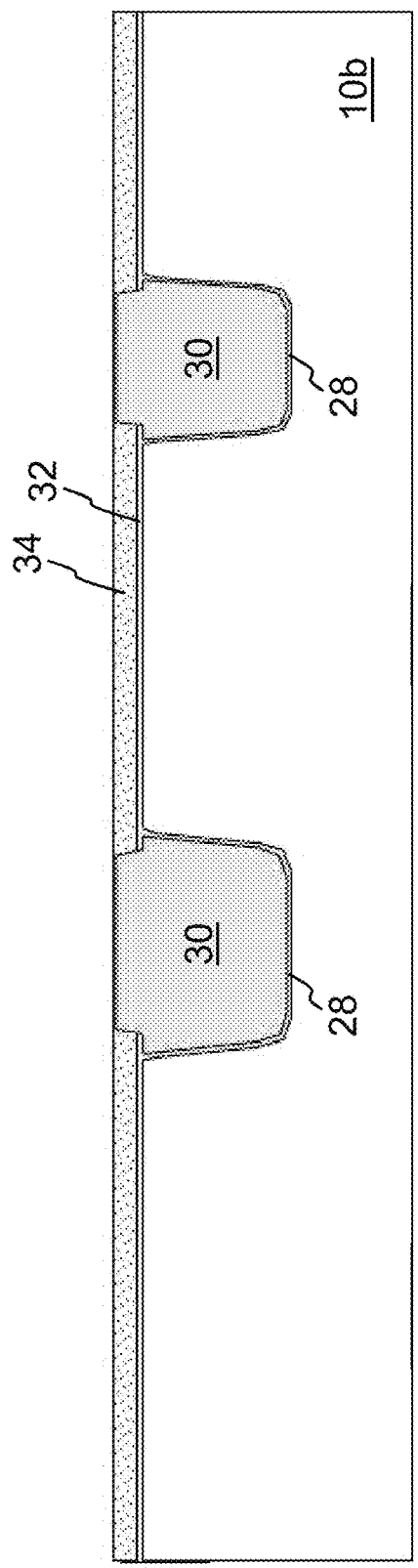
Figure 4D:
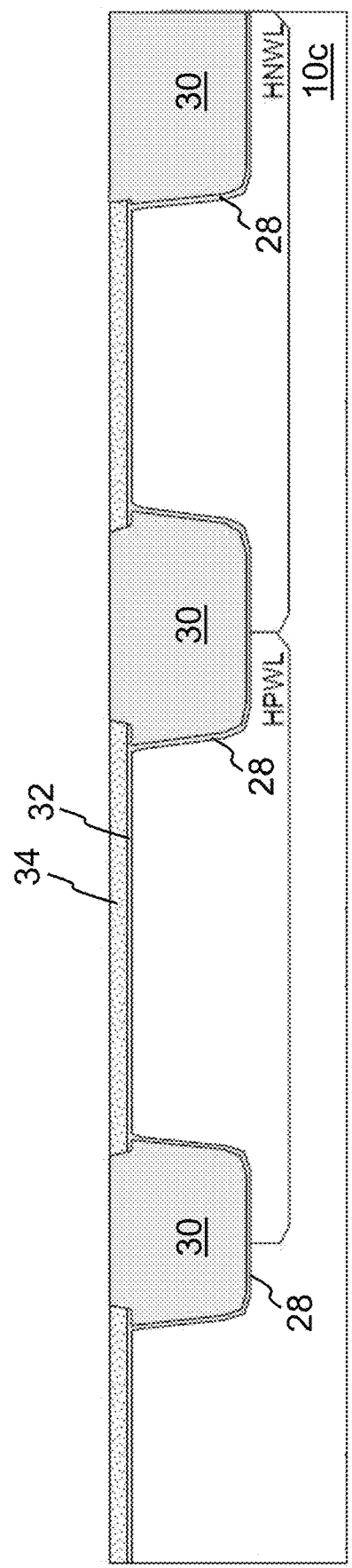
Figure 5A:
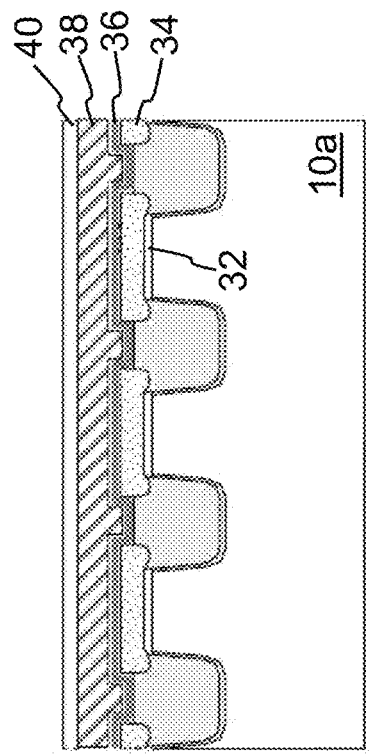
Figure 5B:
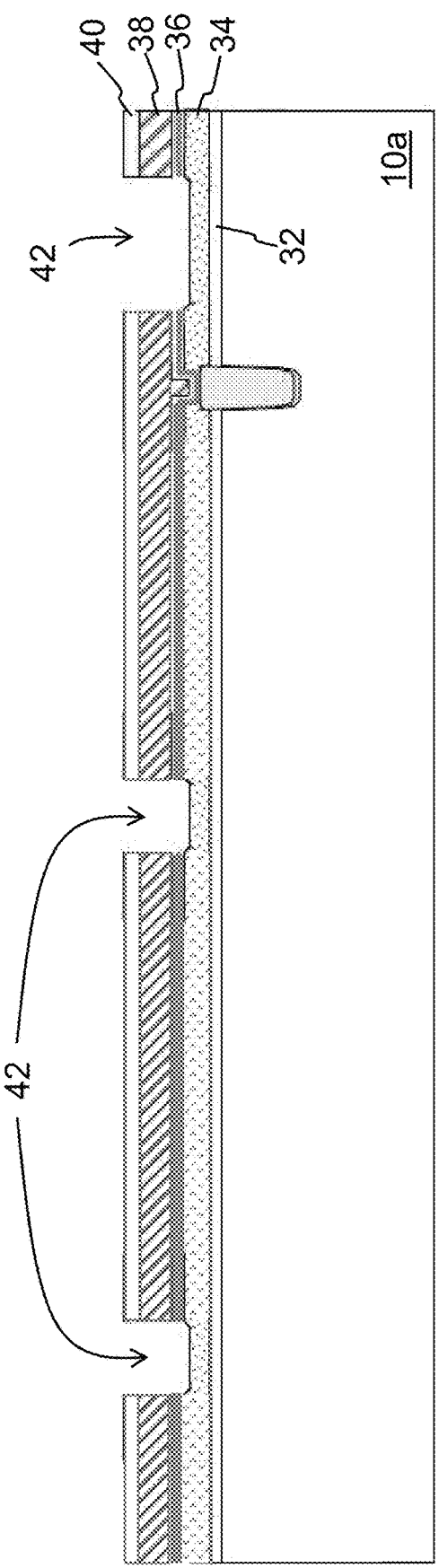
Figure 5C:
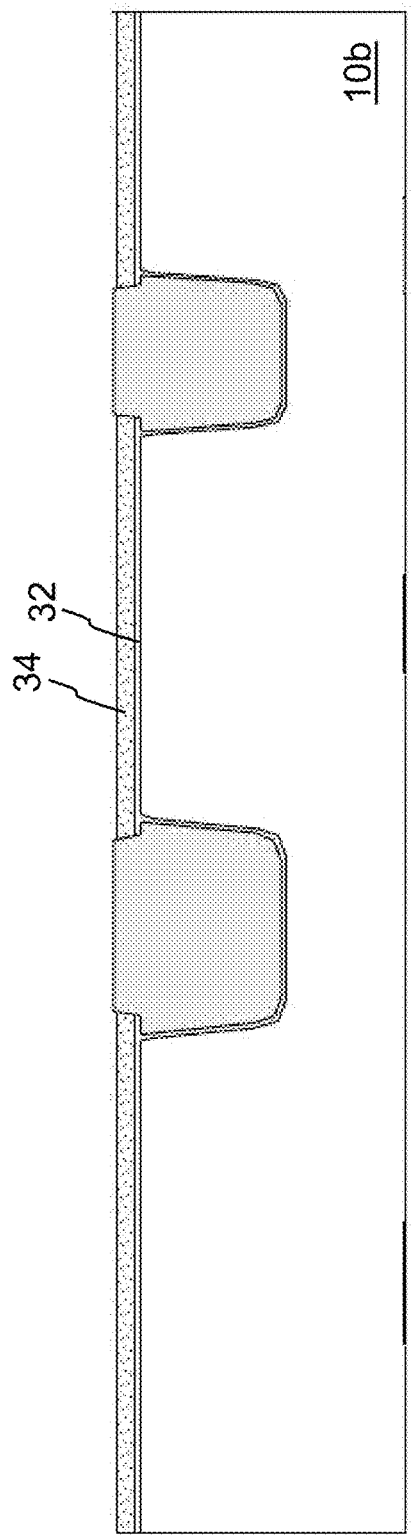
Figure 5D:
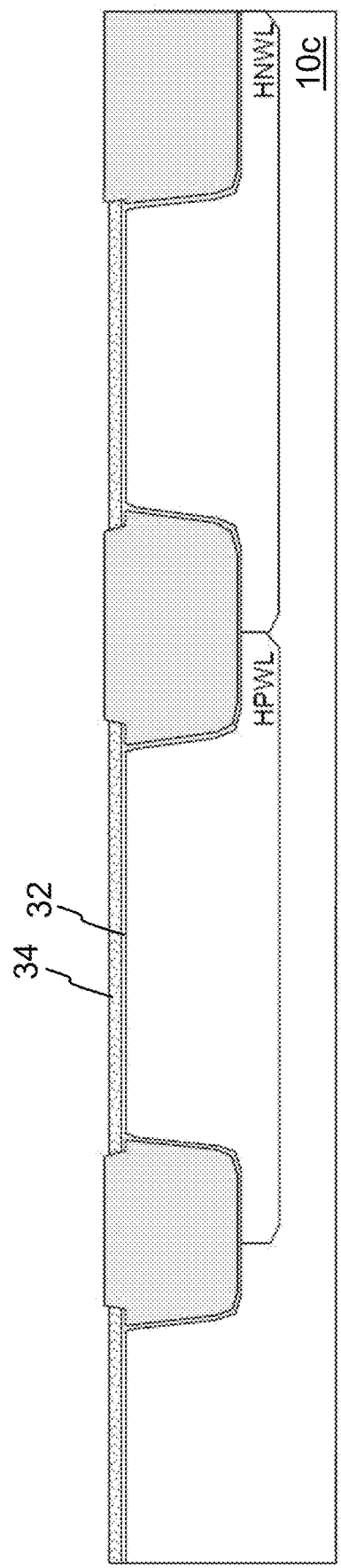
Figure 6A:
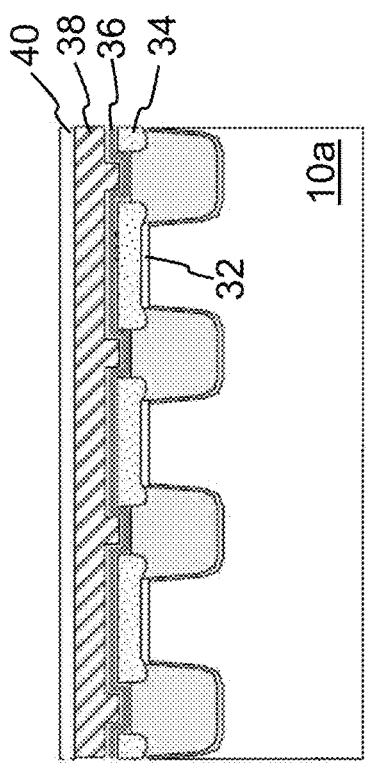
Figure 6B:
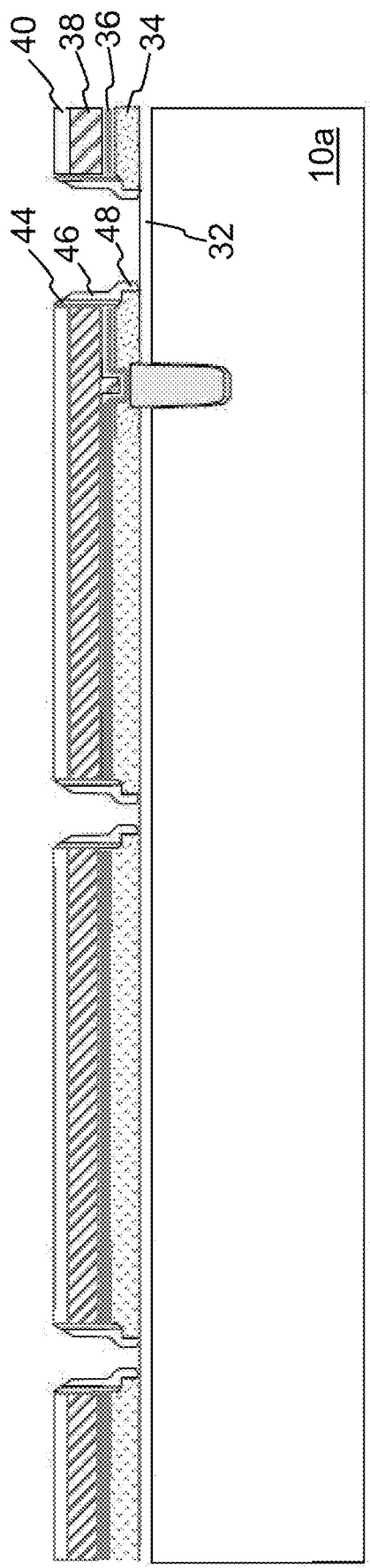
Figure 6C:
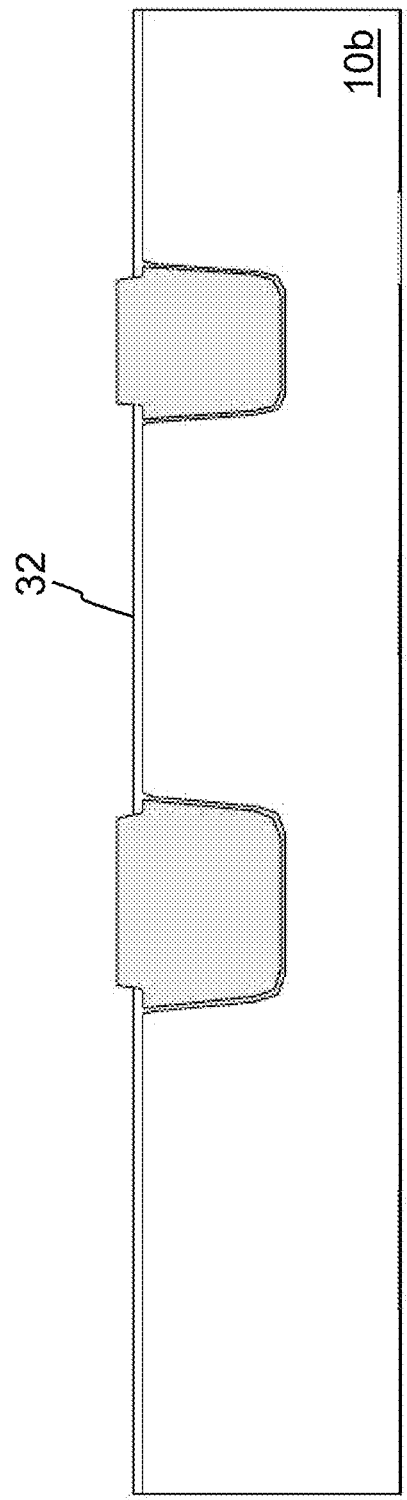
Figure 6D:
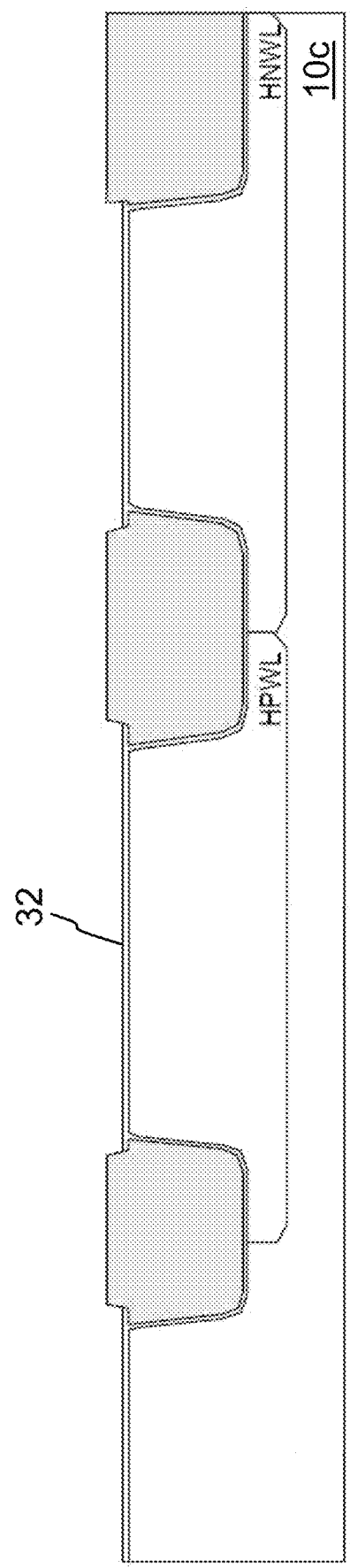
Figure 7A:
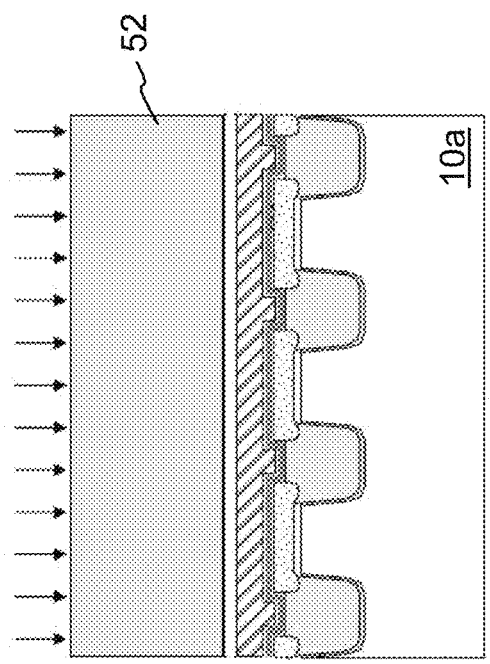
Figure 7B:
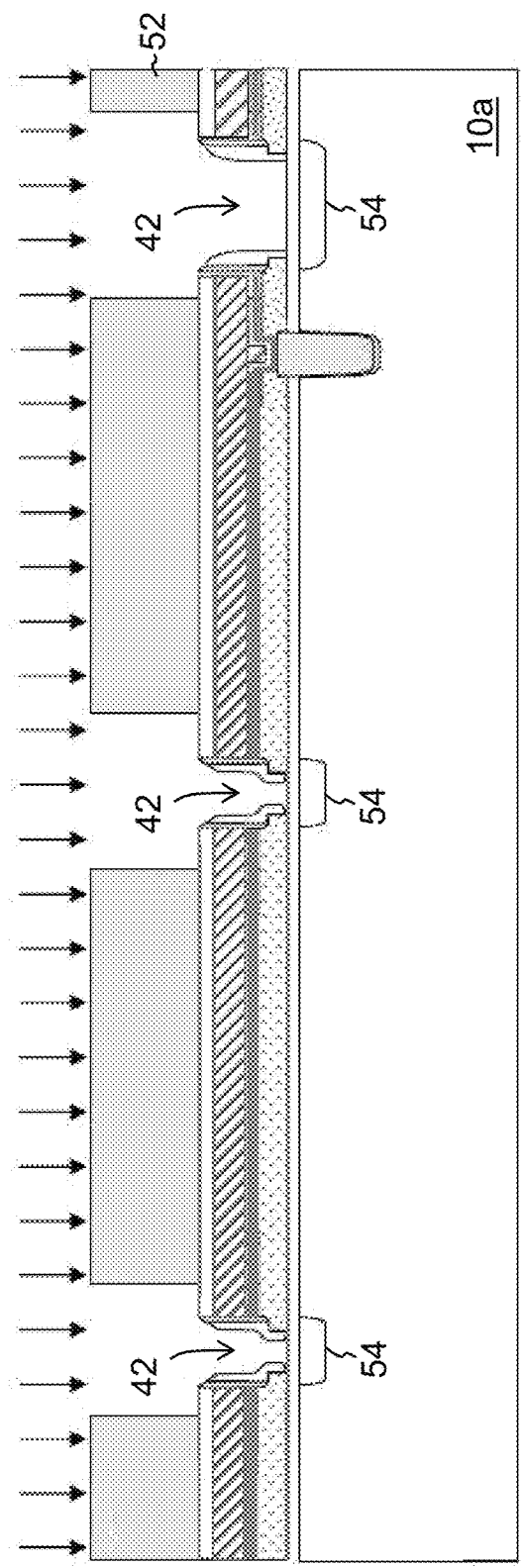
Figure 8A:
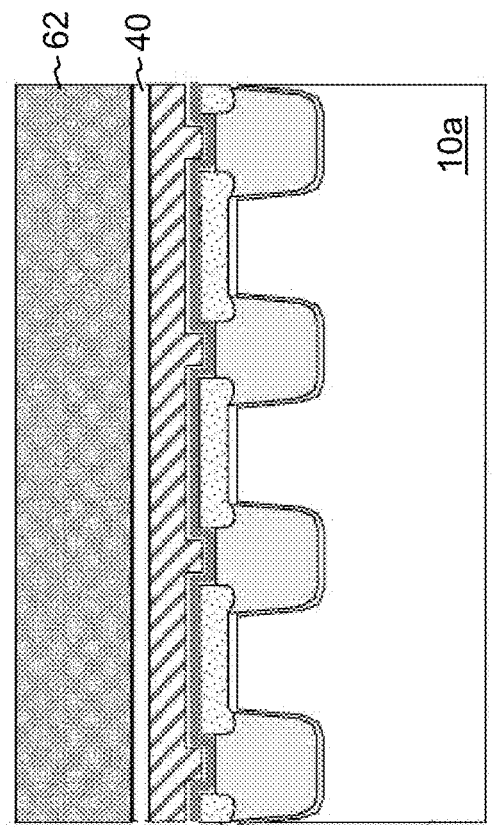
Figure 8B:
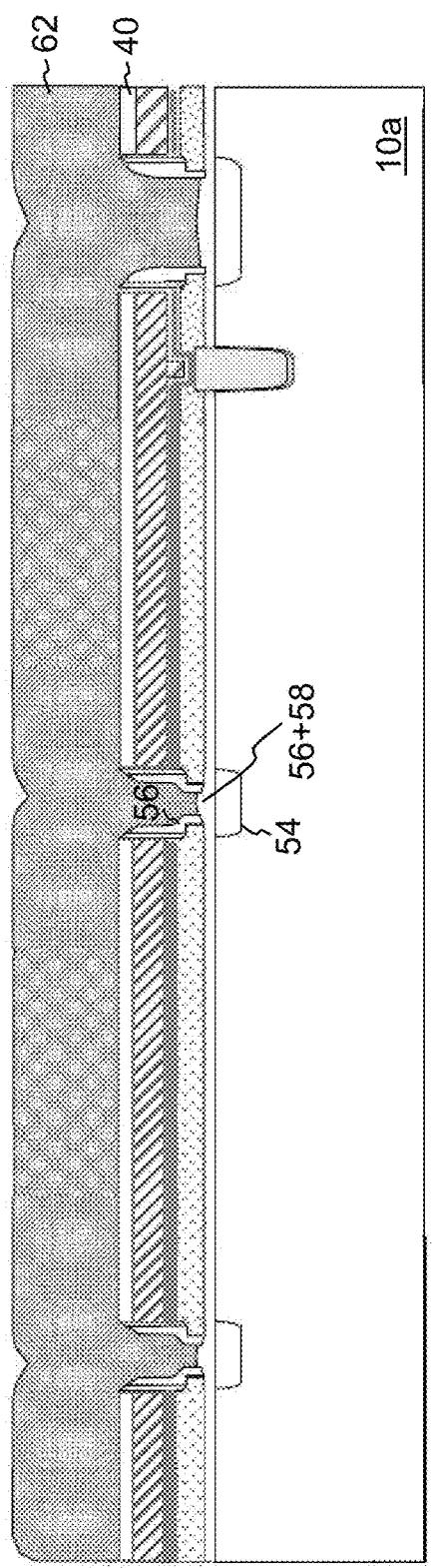
Figure 8C:
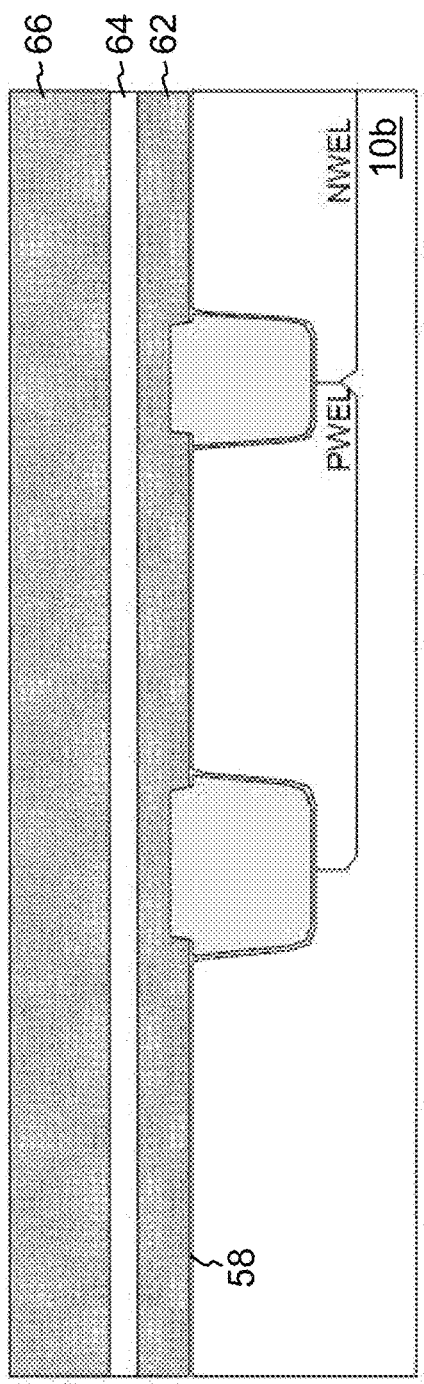
Figure 8D:
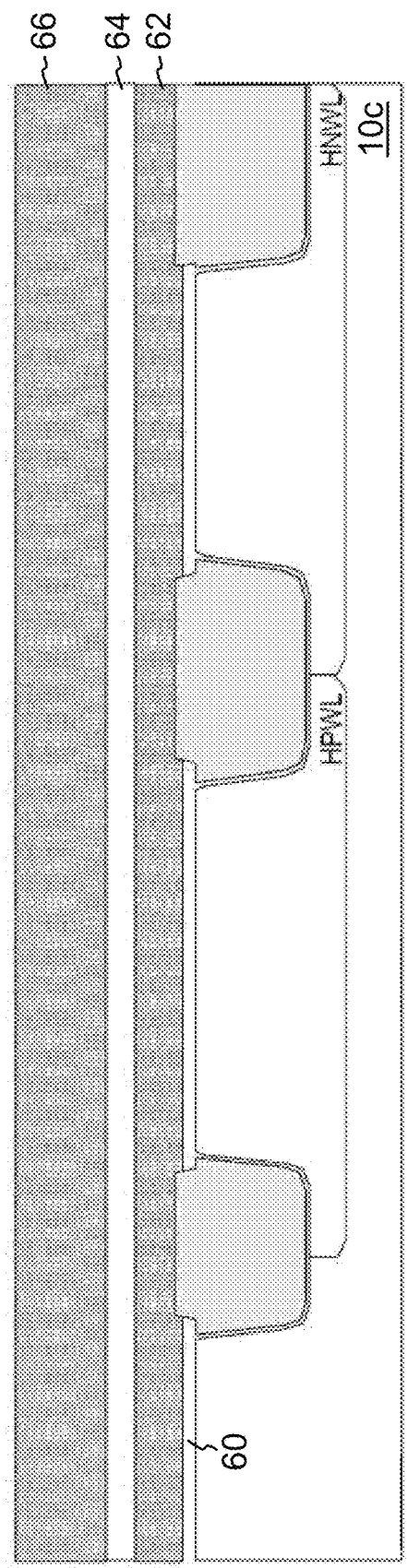
Figure 9A:
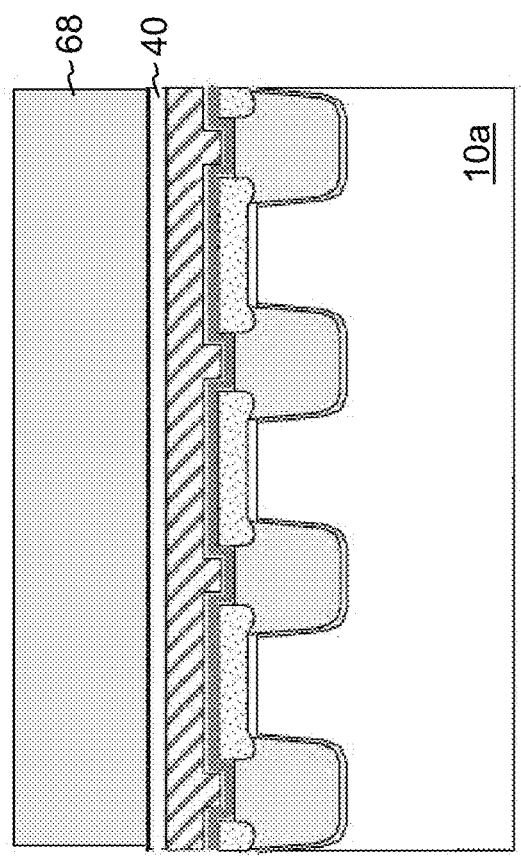
Figure 9B:
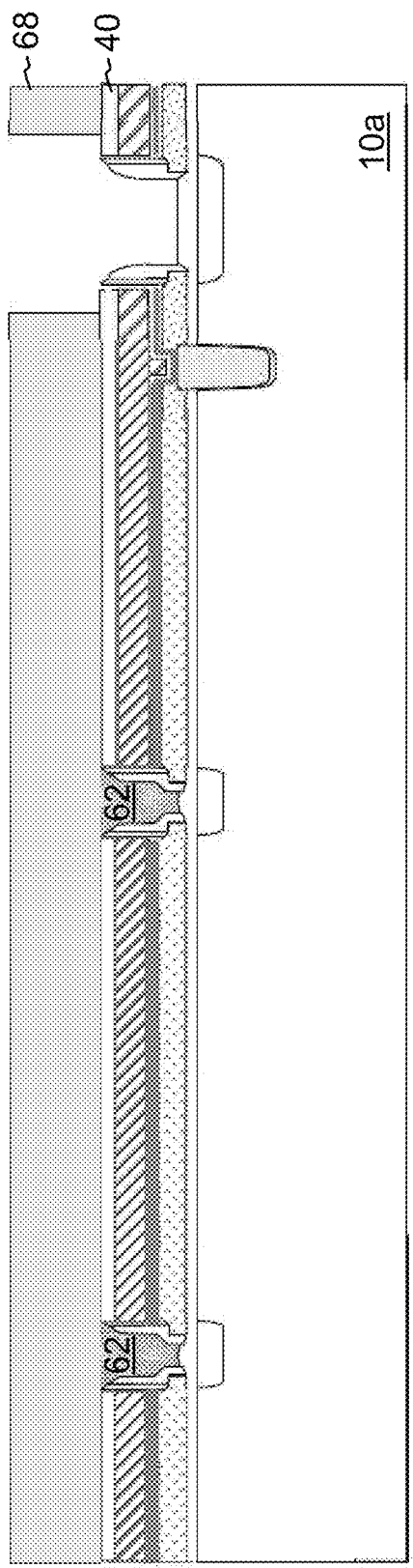
Figure 9C:
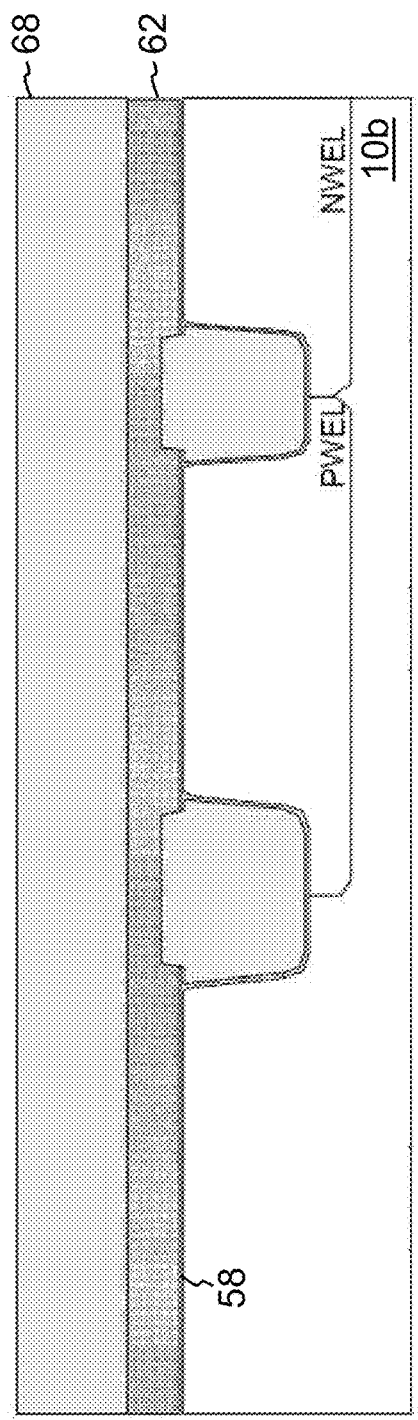
Figure 9D:
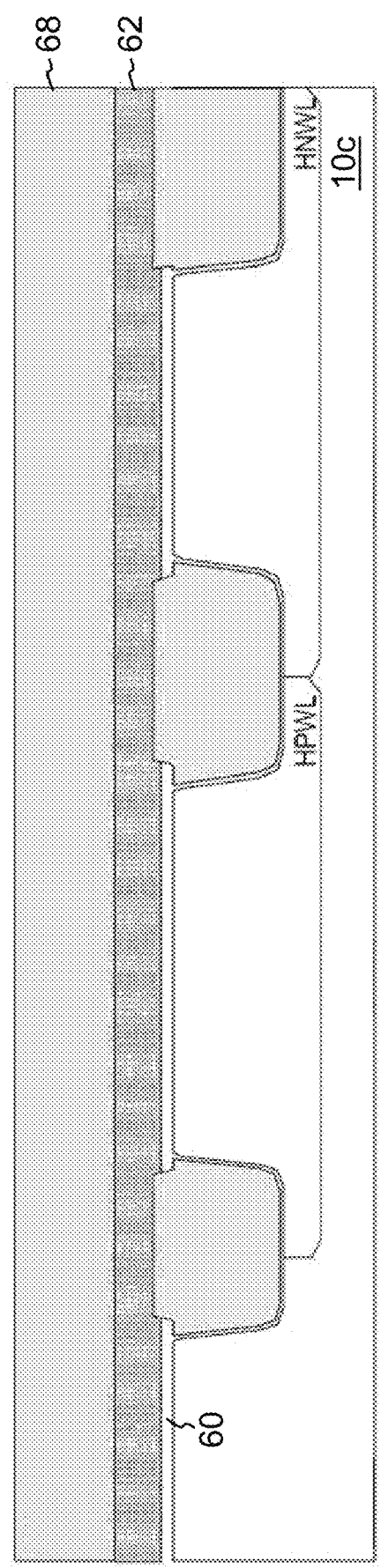
Figure 10A:
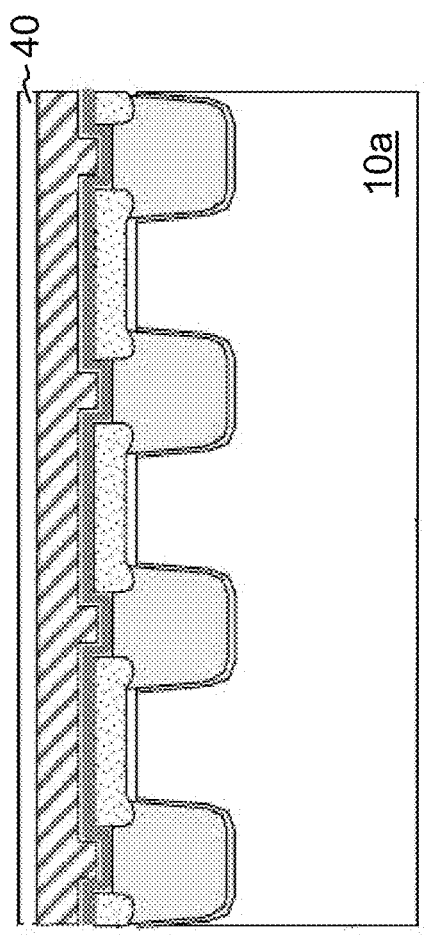
Figure 10B:
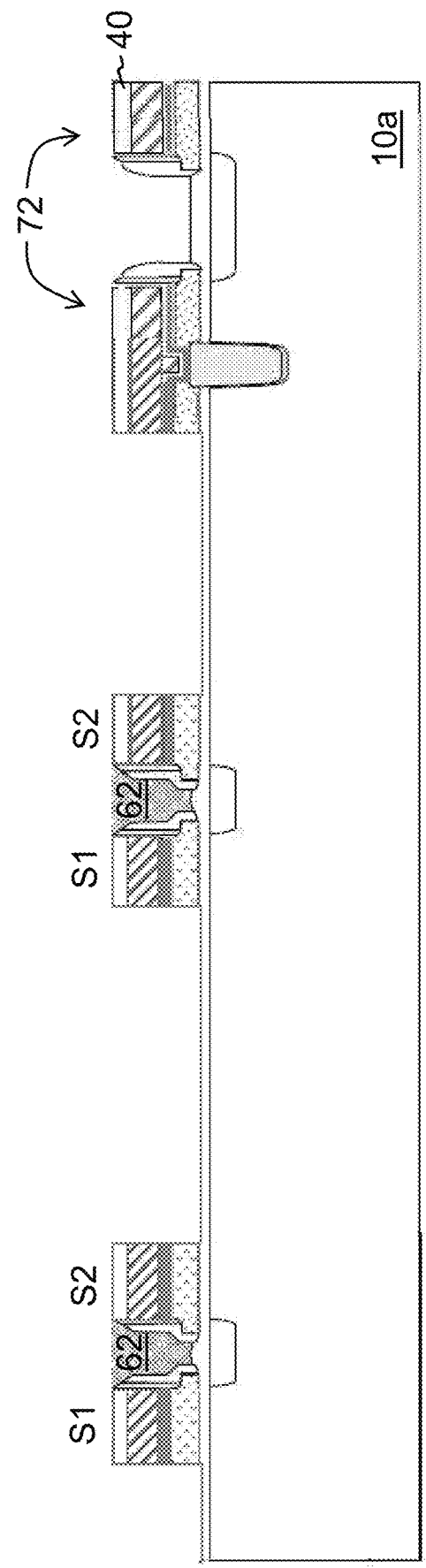
Figure 10C:
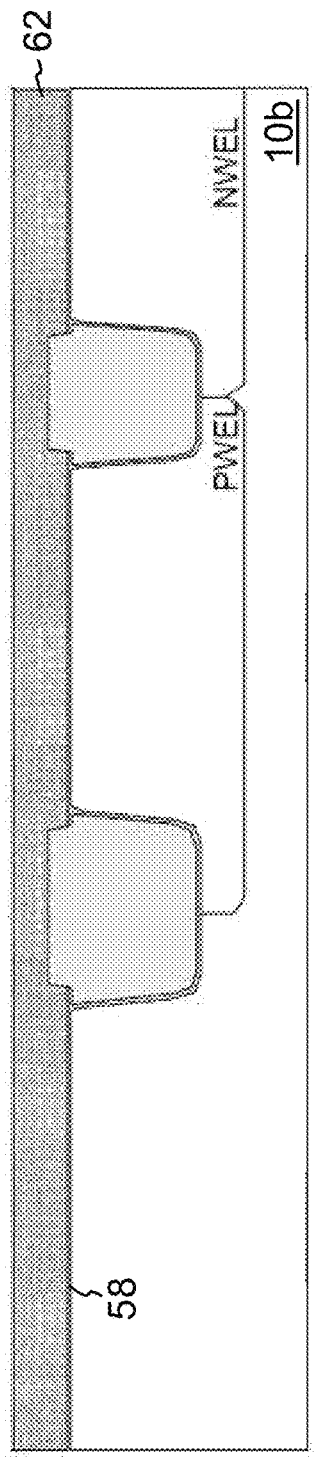
Figure 10D:
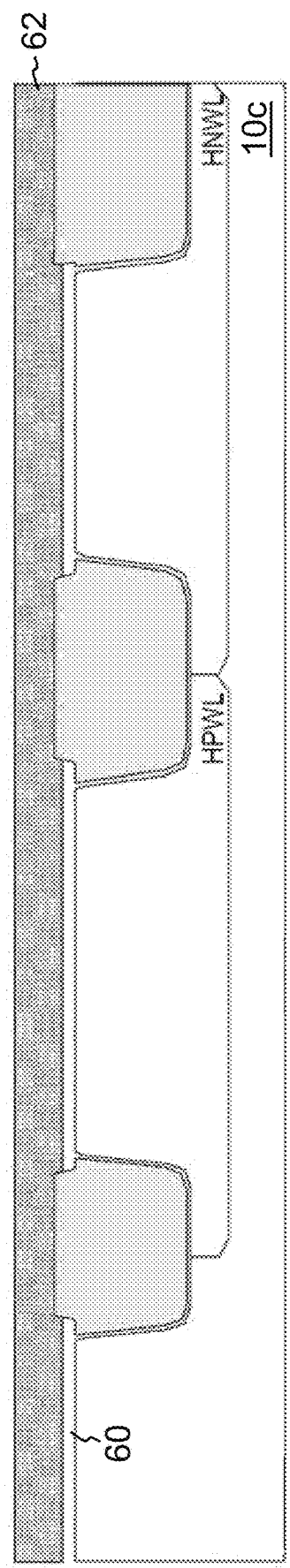
Figure 11A:
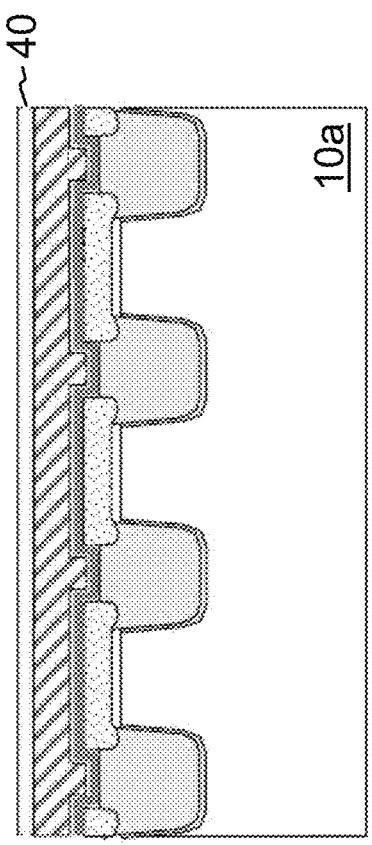
Figure 11B:
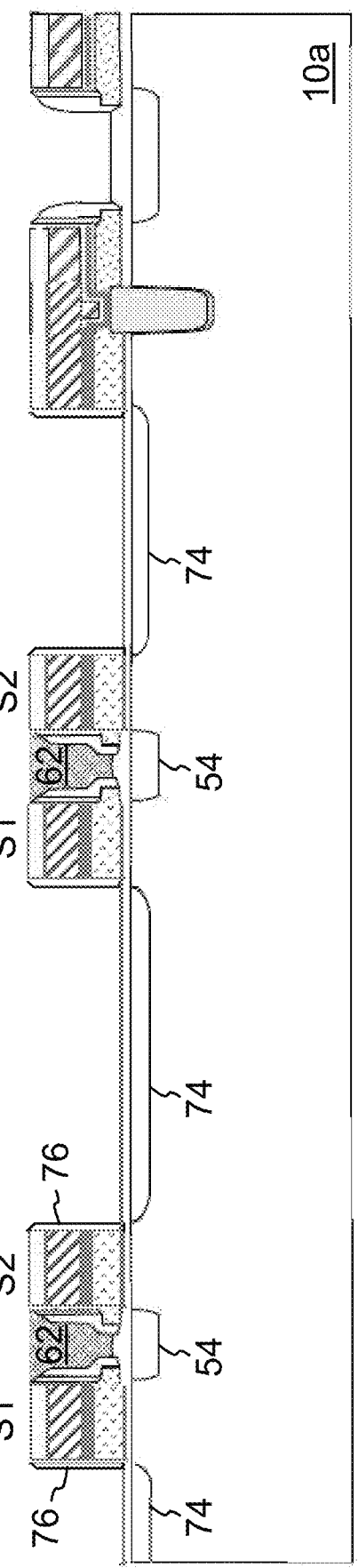
Figure 11C:
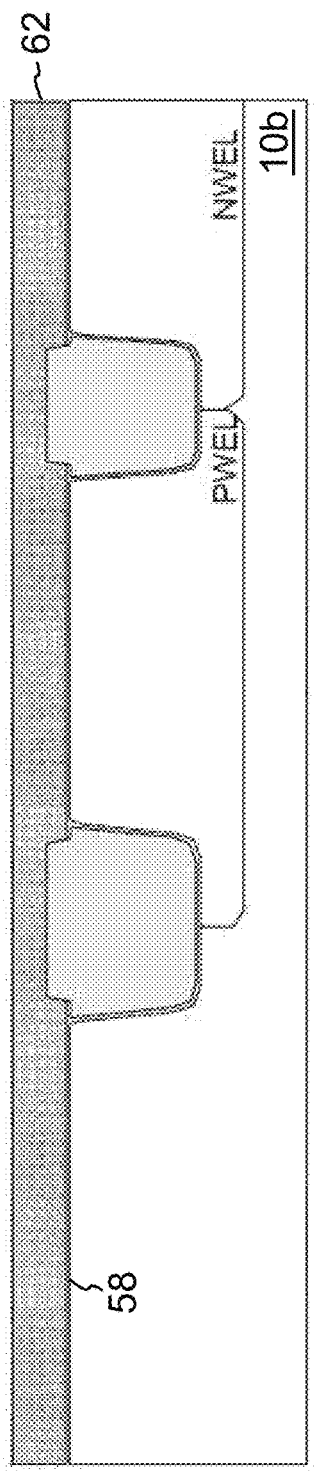
Figure 11D:
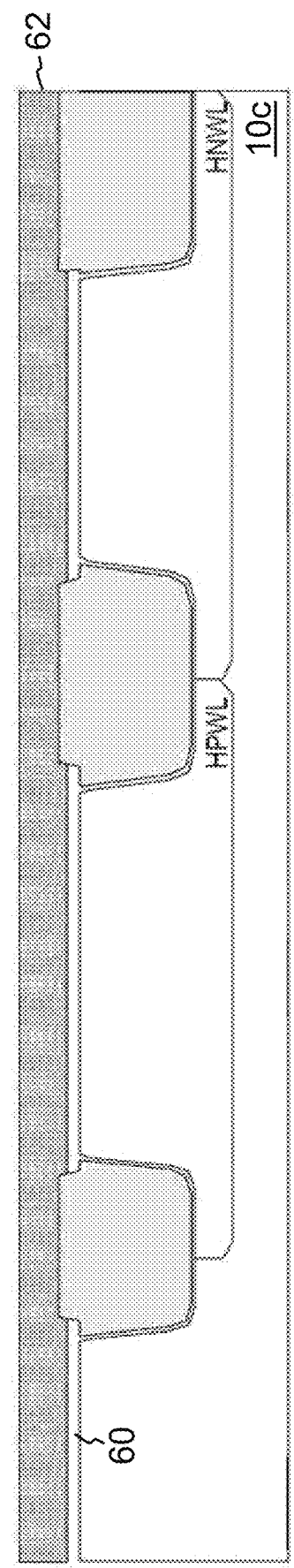
Figure 12A:
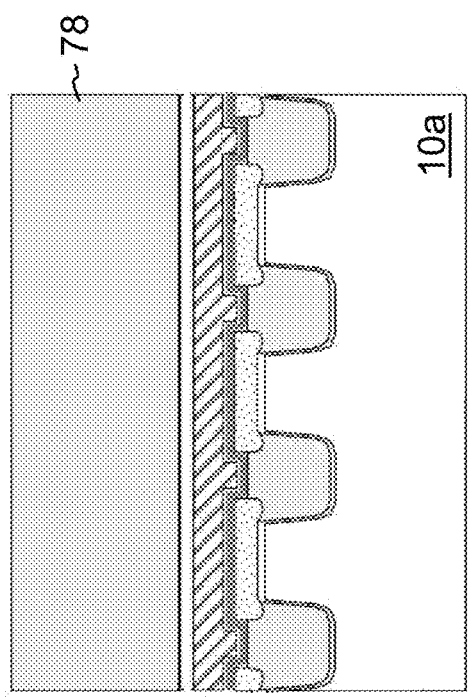
Figure 12B:
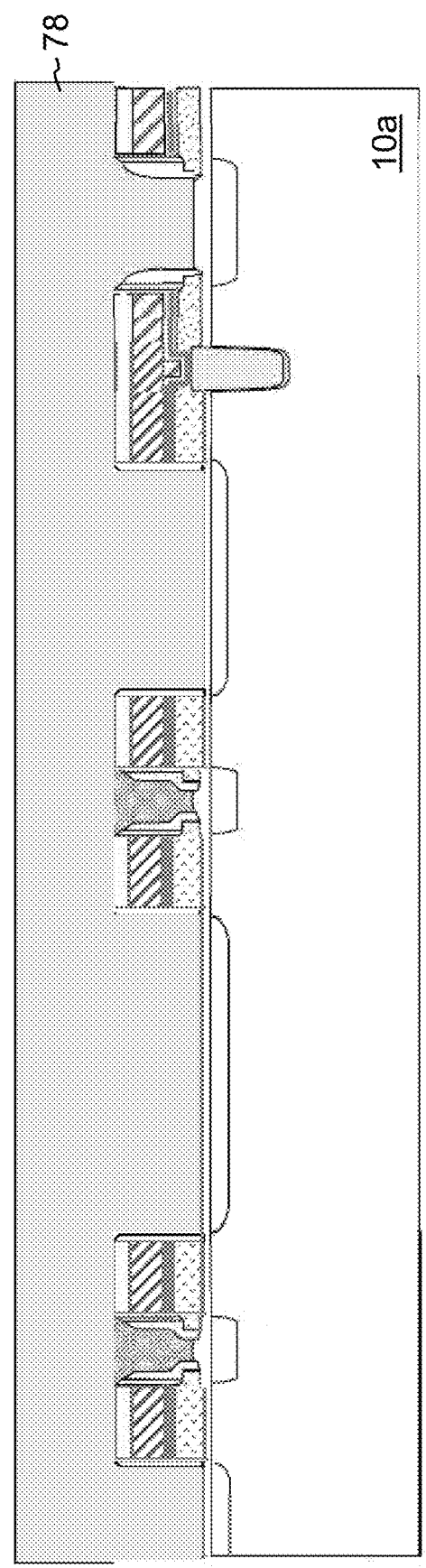
Figure 12C:
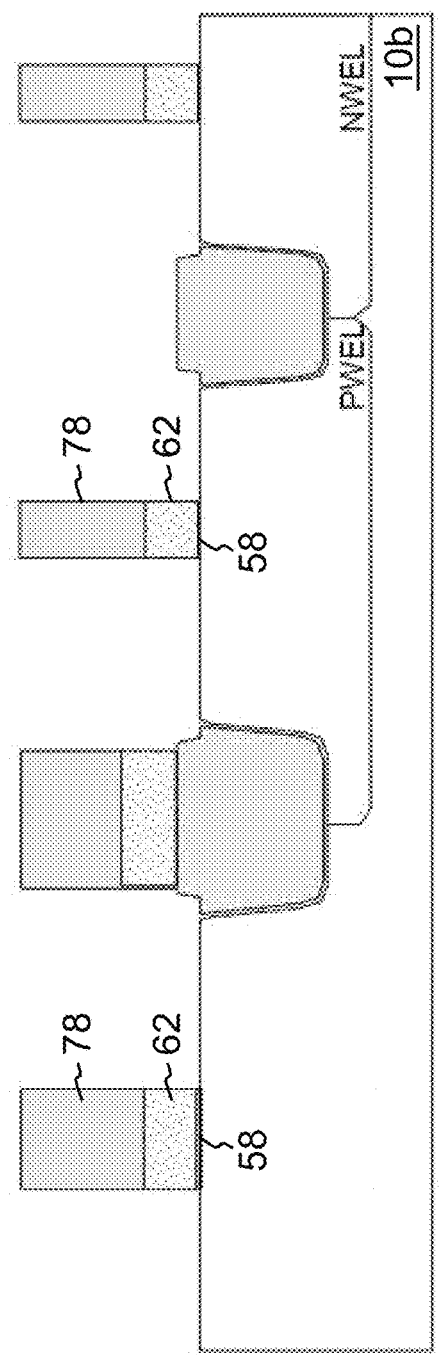
Figure 12D:
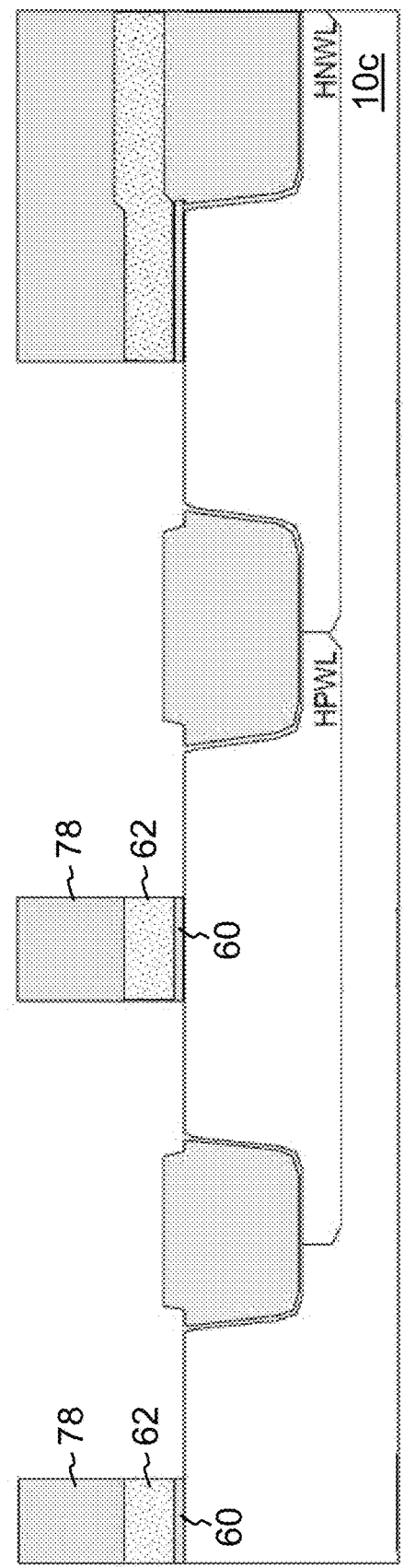
Figure 13A:
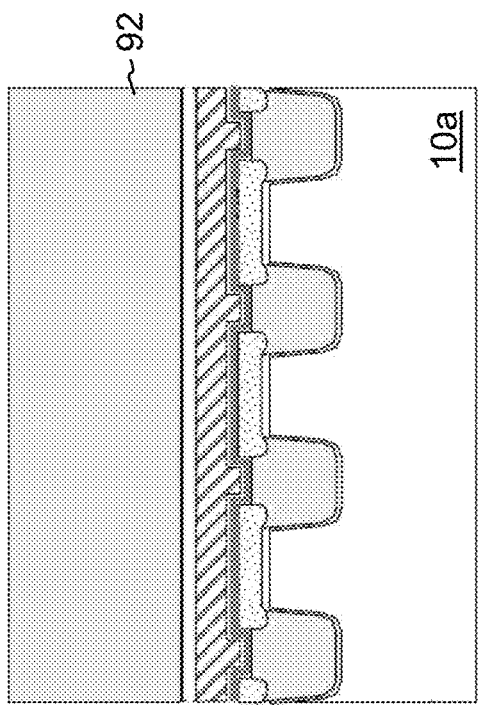
Figure 13B:
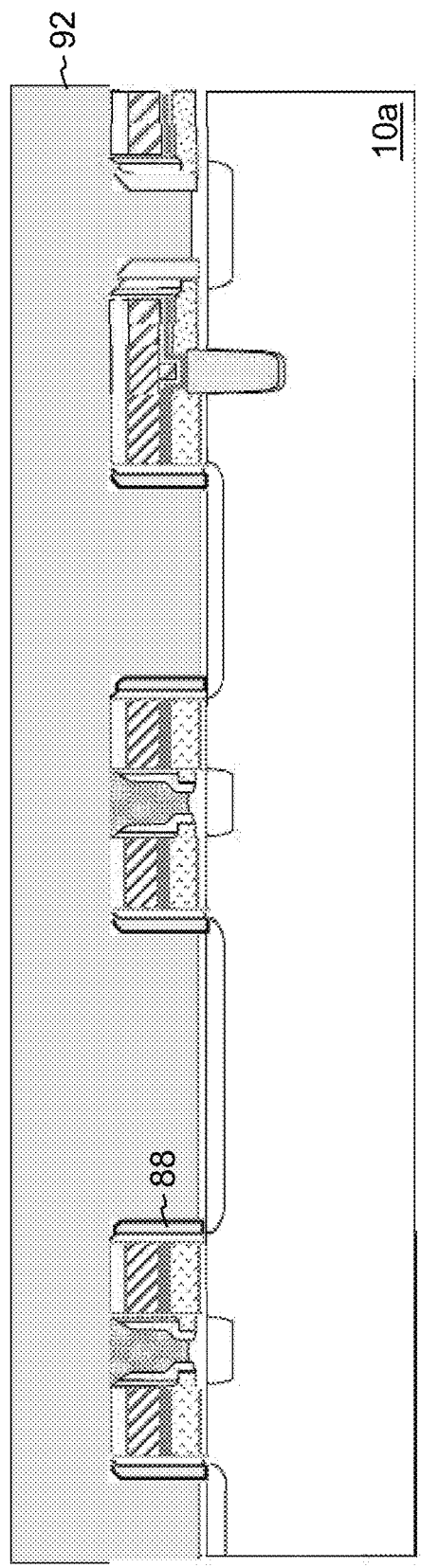
Figure 13C:
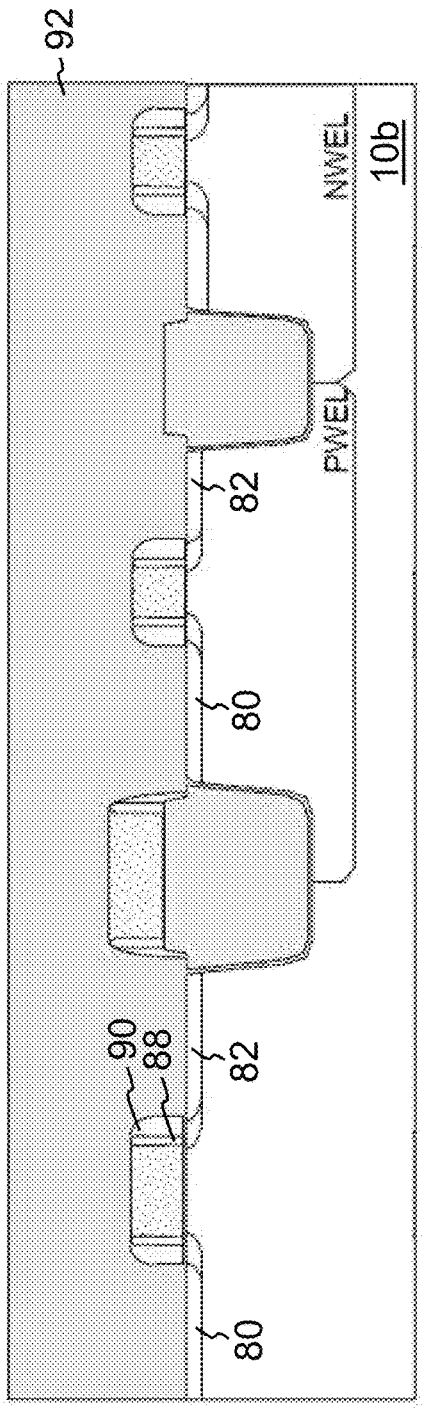
Figure 13D:
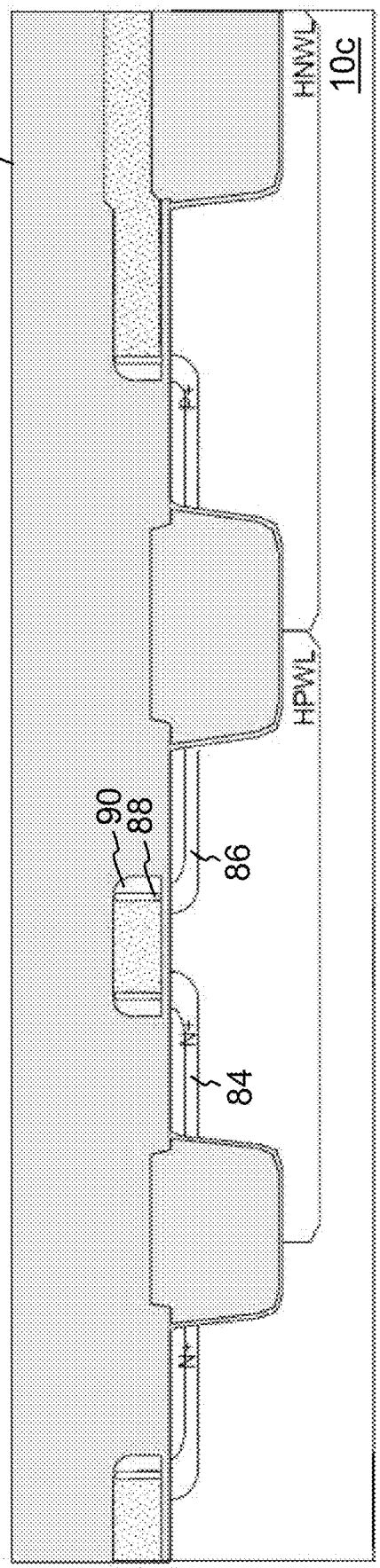

The present embodiment is an improved memory cell and a process for concurrently forming memory array devices having the improved memory cell, low voltage logic devices (core devices) and higher voltage logic devices (HV devices) on the same chip. Specifically, a semiconductor substrate 10 (e.g., a p-type substrate) includes three areas: a memory array area (memory area) 14 in which memory cells will be formed, a core device area (core area) 16 in which core logic devices will be formed, and an HV device area 18 (HV area) in which HV logic devices will be formed, as shown in FIG. 1. Substrate 10 includes three regions 10a, 10b, 10c that correspond to the three areas 14, 16 and 18, respectively.

The process of forming the memory cells is shown in FIGS. 2A-13A (which include cross sectional views of the memory area 14 portion of the substrate region 10a in the word line (WL) direction) and FIGS. 2B-13B (which include cross sectional views of the memory area 14 portion of the substrate region 10a in the bit line (BL) direction which is orthogonal to the WL direction). The process of forming the core devices is shown in FIGS. 2C-13C (which include cross sectional views of the core device area 16 portion of the substrate region 10b). The process of forming the HV devices is shown in FIGS. 2D-13D (which include cross sectional views of the HV device area 18 portion of the substrate region 10c).

The process begins by forming a silicon dioxide (oxide) layer 20 on the substrate surface. A silicon nitride (nitride) layer 22 is formed on the oxide layer 20. A hard mask insulator such as oxide layer 24 is formed on the nitride layer 22. These three layers are formed in all three substrate regions 10a, 10b and 10c, as shown in FIGS. 2A-2D. A photolithography masking step (masking step) is performed to form photoresist over the substrate 10, particularly over the oxide layer 24, selective photoresist exposure, and selective removal of portions of the photoresist, leaving selected portions of the underlying material (oxide 24 in this case) exposed. Anisotropic oxide, nitride and silicon etches are performed in the areas left exposed by the photoresist to form trenches 26 that extend through the oxide 24, nitride 22 and oxide 20 layers, and into the silicon substrate 10. These trenches 26 are formed in all three substrate regions 10a-10c. The resulting structures are shown in FIGS. 3A-3D (after photoresist removal).

A liner layer 28 of oxide is formed along the silicon walls of the trenches 26. Oxide is formed over the structure, followed by an oxide chemical-mechanical polish (CMP), which in combination fills the trenches 26 with STI (shallow trench isolation) oxide insulation 30, and which removes oxide 24 on nitride 22. A nitride etch is used to remove nitride layer 22. A series of implants are performed for different areas of the substrate (e.g., cover all areas of the substrate with photoresist except the target area, perform an implant, and repeat for other areas), to form HNWL well (HV NMOS device well) and HPWL well (HV PMOS device well) in the HV area 18. An oxide etch is then used to remove oxide layer 20. An oxide layer 32 (FG oxide) is formed on the exposed silicon surface between STI oxide stacks 30. A polysilicon layer 34 (FG poly, i.e. polysilicon that will form the floating gate) is deposited over the structure, followed by a poly implant or by in-situ doped poly, implant anneal, and polysilicon CMP (using STI oxide 30 as polishing stop). The resulting structure is shown in FIGS. 4A-4D. Further implantation of the poly layer 34 in the memory area 14 can be performed at this time (while protecting the core and the HV device areas 16/18 with photoresist). It should be noted that STI oxide 30 and FG poly 34 can also be formed using a self-aligned STI process, where the FG poly 34 includes a first poly layer that is defined during the STI etch and a second poly layer that defined by a conventional lithography process.

The STI oxide blocks 30 are recessed down below the top surface of poly layer 34 by an oxide etch. A gate insulator 36 is then formed over the structure. Preferably, the gate insulator 36 is a composite insulator having oxide, nitride, oxide sublayers (ONO). A layer of polysilicon (CG poly, i.e. polysilicon that will form the control gate) 38 is deposited over the structure. It is preferably subject to implant and anneal, or in-situ doped poly can be used. A hard mask insulator (HM) 40, such as oxide, nitride or a composite of both is formed over the CG poly layer 38. A buffer oxide can optionally be added. Up through this step, the oxide 32, poly 34, ONO 36, poly 38 and HM insulator 40 layers have been formed over all three substrate regions 10a-10c. A masking step is then used to selectively cover portions of the memory area 14 with photoresist (leaving exposed all of the core and HV device areas 16/18). A series of oxide, nitride and poly etches are then used to remove the exposed portions of the buffer oxide (if used), HM insulator 40, poly 38, ONO 36 and top portions of the poly 34 in the memory area 14, forming trenches 42 extending through these layers. The buffer oxide (if used), HM insulator 40, poly 38, ONO 36 and top portions of the poly 34 are removed from the core and HV device areas 16/18. The resulting structures are shown in FIGS. 5A-5D (after photoresist removal).

Nitride spacers 44 are formed along the sidewalls of trenches 42 in memory area 14 by nitride deposition and nitride etch. Oxide spacers 46 are formed along nitride spacers 44 in trenches 42 in memory area 14 by oxide deposition and oxide etch. A poly etch is then used to remove the portions of poly layer 34 exposed at the bottom of trenches 42 (between oxide spacers 46) and in the core/HV areas 16/18. Oxide spacers 48 are formed on the exposed sides of poly layer 34 by high temperature oxide deposition (HTO), anneal, and oxide etch. The resulting structures is shown in FIGS. 6A-6D.

A series of implants are performed for different areas (e.g., cover all areas of the substrate with photoresist except the target area, and perform an implant, repeat for other areas), to form PWEL and NWEL wells in the core area 16. A masking step is used to cover the memory area 14 and the core area 16 with photoresist, leaving HV area 18 exposed. Remaining oxide 32 in HV area 18 is removed by oxide etch. After the photo resist is removed, an oxide layer 50 is formed over the substrate (e.g., by RTO/HTO deposition(s)). After photoresist removal, a masking step is used to cover the memory area 14, core area 16 and HV area 18 with photoresist 52, except for the trenches 42 in the memory area 14. An implant is then used to form source regions 54 in the substrate under trenches 42 in memory area 14, as shown in FIGS. 7A-7D.

An oxide etch (preferably a wet etch) is then performed to remove the oxide spacers 46 and 48, and oxide layer 32, in trenches 42 in the memory area 14, exposing sidewalls of poly layer 34 and the substrate 10a surface. Photoresist 52 is then removed, after which oxide 56 is formed along the sidewalls of trenches 42 as spacers and along the substrate 10a surface in the memory area 14 by oxide deposition and etch. Masking steps and oxide etch/formation steps are performed to form a first gate oxide 58 on the substrate in the core area 16 and a second gate oxide 60 in the HV area 18. Second gate oxide 60 (which is the combination of oxide layer 50 and oxide layer 56 and oxide layer 58) is thicker than first gate oxide 58. The oxide over source regions 54 is the combination of oxide layer 56 and oxide layer 58. Polysilicon layer 62 is then formed over the structures. Oxide layer 64 is formed over poly layer 62. Masking and etch steps are used to remove oxide layer 64 from the memory area 14. Polysilicon deposition is then performed to thicken poly layer 62 in the memory area 14, and form dummy poly layer 66 in the core and HV areas 16/18. The resulting structures are shown in FIGS. 8A-8D.

A polysilicon CMP is performed to remove dummy poly layer 66 in the core and HV areas 16/18, and to remove poly layer 62 in the memory area except for blocks of the poly layer 62 in the trenches 42 (over the source regions 54). An oxide etch is used to remove oxide layer 64 in the core and HV areas 16/18. A masking step is used to form photoresist 68 over the structures, except a strap region 70 of the memory area 14. A poly etch is used to remove poly block 62 in the strap region 70. The resulting structure is shown in FIGS. 9A-9D.

After removal of photoresist 68, a masking step is performed to cover the structures with photoresist, except for portions of the memory area 14 between the poly blocks 62. A series of etches are performed to remove the exposed portions of HM insulator 40, poly layer 38, ONO 36 and poly layer 34, leaving pairs of memory stack structures S1 and S2 of these layers in the memory area 14 (one stack on each side of poly block 62), which will eventually form pairs of memory cells, and additional structure 72 in strap region 70 that can be used for control gate and source line strapping. The resulting structure is shown in FIGS. 10A-10D (after photoresist removal).

A masking step is used to form photoresist over the core and HV areas 16/18, leaving the memory area 14 exposed. An implantation is then performed in the memory area 14 to form drain regions 74 in the substrate between adjacent pairs of stacks S1/S2. After photoresist removal, oxide spacers 76 are formed along the sides of the stacks S1/S2 (e.g., by HTO spacer deposition, anneal and etch), as shown in FIGS. 11A-11D. A masking step is next used to cover all the areas with photoresist 78, and remove the photoresist 78 from portions of the core and HV areas 16/18 leaving those areas exposed. The exposed portions of poly layer 62 are then removed by poly etch, leaving blocks of poly layer 62 in the core and HV areas 16/18, as shown in FIGS. 12A-12D.

After removal of photoresist 78, a series of masking steps and implantations are performed to form source regions 80 and drain regions 82 in the substrate adjacent the poly blocks 62 in the core region 10b of the substrate, and source regions 84 and drain regions 86 in the substrate adjacent the poly blocks 62 in the HV region 10c of the substrate. Source and drain regions 84, 86 in HV area 18 are formed deeper into the substrate than source and drain regions 80, 82 in core area 16 for higher voltage operation. Oxide spacers 88 and 90 are formed along the sidewalls of poly blocks 62 by oxide deposition and etch. A thick layer of insulation material (e.g., ILD oxide) 92 is formed over the structure, as shown in FIGS. 13A-13D. Post end processing is then performed, which includes forming holes or trenches through the insulation 92 to expose the memory cell drain regions, as well as the source, drain and gates of the logic devices, and filling the holes or trenches with conductive material (i.e. any appropriate metal) to form vertically extending contacts, which is well known in the art.

Figure 14:
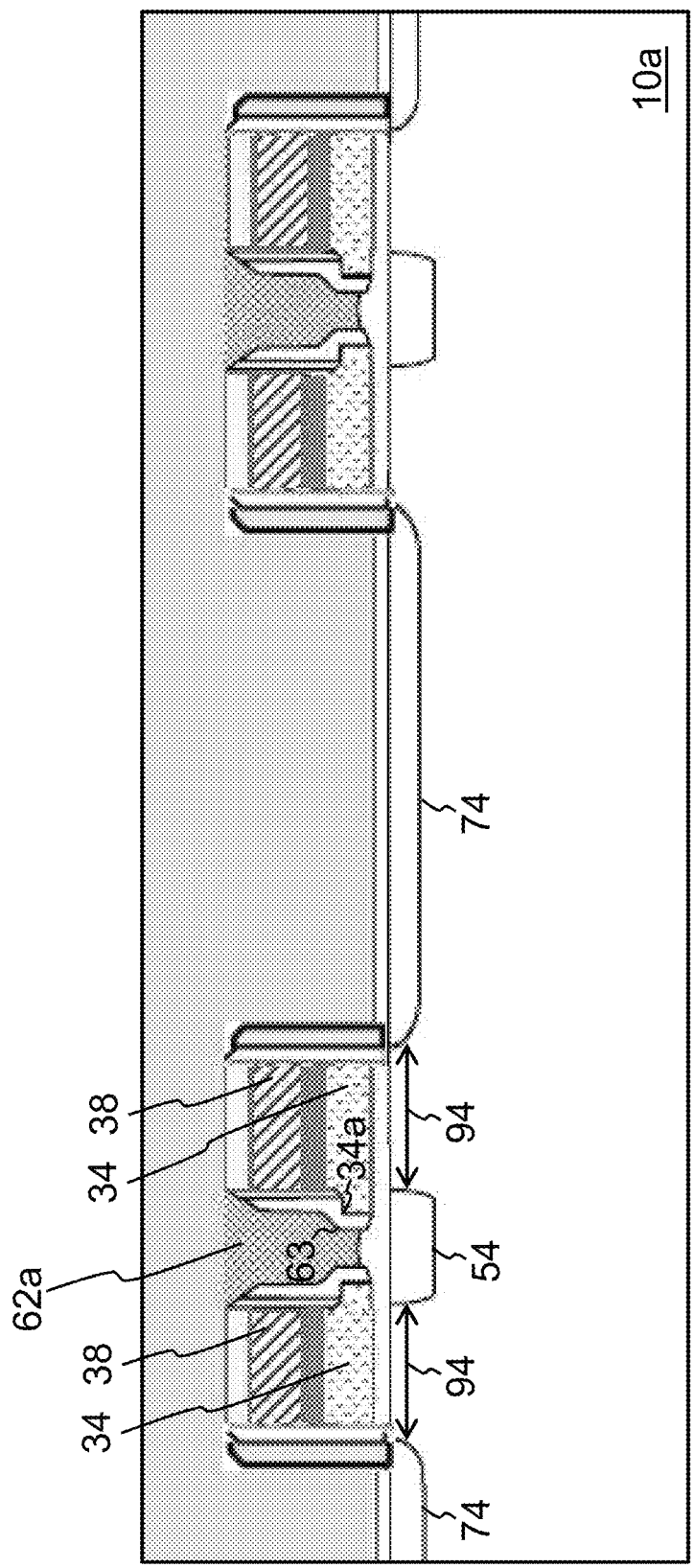
FIG. 14 is a side cross sectional view of the memory cells formed in the memory array area of the substrate.

FIG. 14 shows the final structure of the memory cells in the memory area 14. Pairs of memory cells are formed end to end, each memory cell including a source region 54 and drain region 74, with a channel region 94 of the substrate extending there between. A floating gate 34 is disposed over and insulated from the channel region 94. The floating gate 34 solely controls the conductivity of the channel region 94 (i.e., it is the only gate that is directly over and insulated from the channel region, as compared to a split gate configuration where the floating gate is disposed over and controls the conductivity of a first portion of the channel region and another gate is disposed over and controls the conductivity of a second portion of the channel region). A control gate 38 is disposed over and insulated from the floating gate 34. An erase gate 62a is disposed over and insulated from the source region 54, and is adjacent to and insulated from the floating gate 34. The erase gate 62a includes a notch 63 facing an edge 34a of the floating gate 34. Each pair of memory cells shares a common source region 54 and erase gate 62a. Adjacent pairs of memory cells share a common drain region 74. An array of the memory cells is preferably formed at the same time, with the memory cells arranged in rows and columns. The pairs of memory cells shown in FIG. 14 extend in the column direction. Each column of memory cells includes a bit line (BL) that electrically connects to all the drain regions 74 in the column of memory cells. Each row of memory cells includes an erase gate line (EGL) that electrically connects to all the erase gates 62a in the row of memory cells. Each row of memory cells includes a control gate line (CGL) that electrically connects to all the control gates 38 in the row of memory cells. Each row of memory cells includes a source line (SL) that electrically connects to all the source regions 54 in the row of memory cells.

Figure 15:
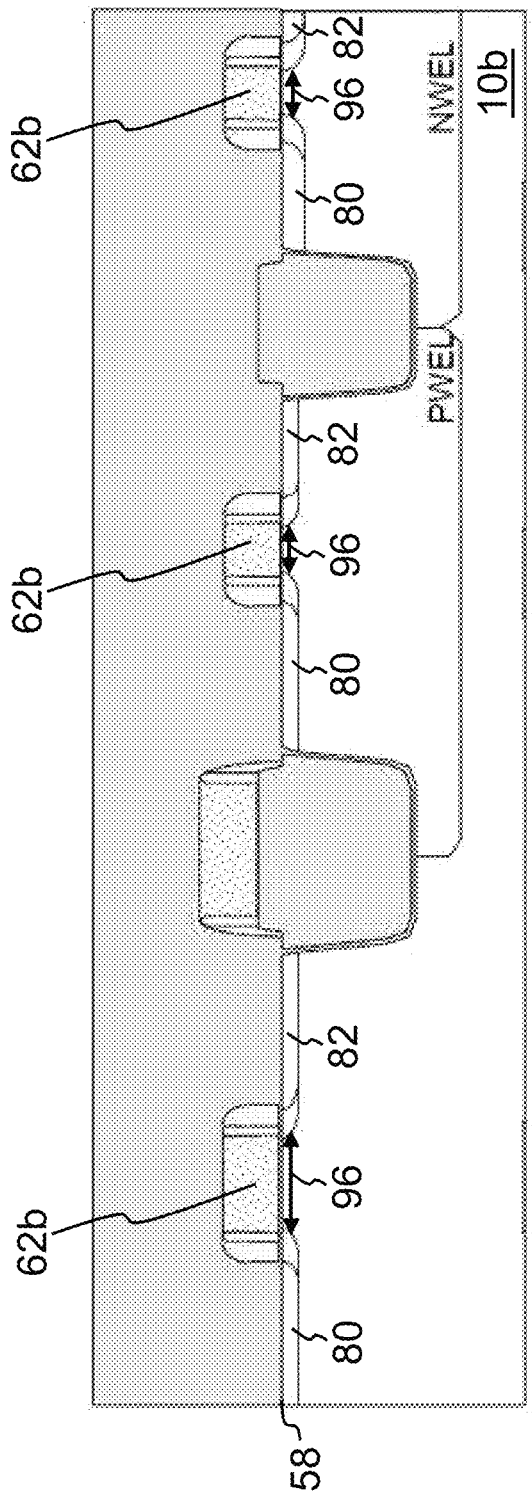
FIG. 15 is a side cross sectional view of the logic devices formed in the core device area of the substrate.

FIG. 15 shows the final structure of the logic devices in the core area 16. Each logic device includes a source region 80 and drain region 82, with a channel region 96 of the substrate extending there between. A logic gate 62b is disposed over and insulated from the channel region 96 (for controlling the conductivity of the channel region 96).

Figure 16:
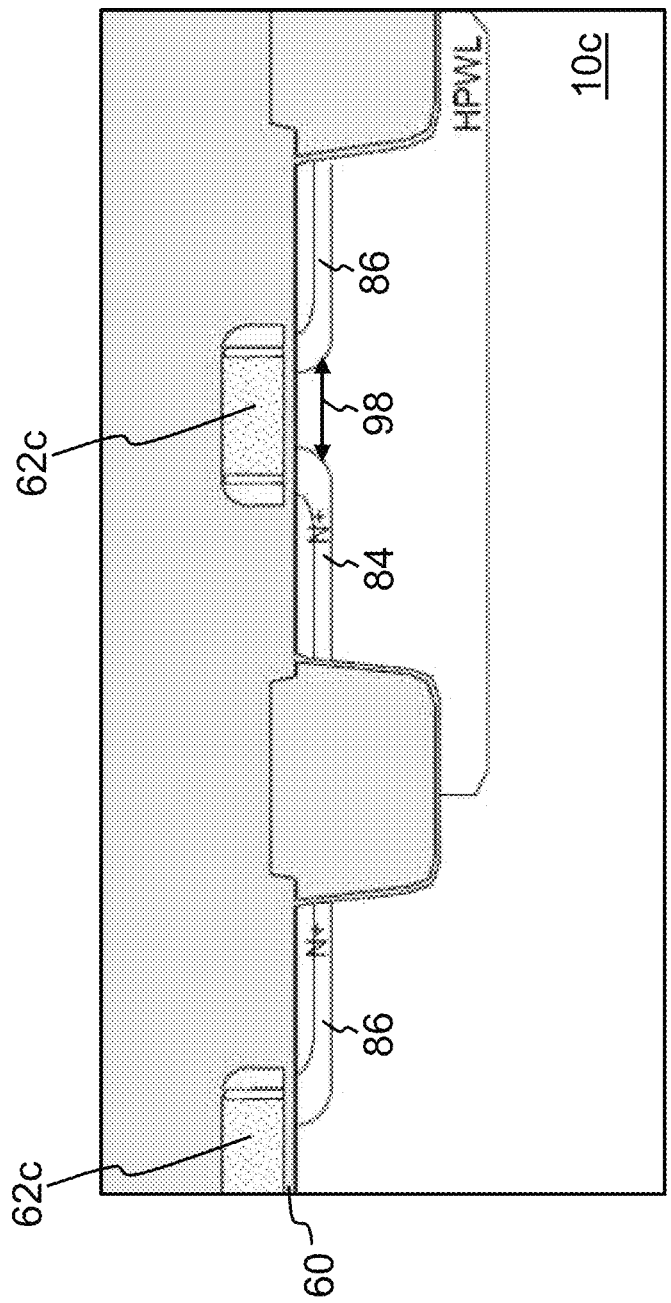
FIG. 16 is a side cross sectional view of the logic devices formed in the HV device area of the substrate.

FIG. 16 shows the final structure of the logic devices in the HV area 18. Each logic device includes a source region 84 and drain region 86, with a channel region 98 of the substrate extending there between. A logic gate 62c is disposed over and insulated from the channel region 98 (for controlling the conductivity of the channel region 98). The logic devices in the HV area 18 can operate at a higher voltage because of the thicker oxide layer 60 underneath the gate 62c compared to thinner oxide layer 58 under logic gate 62b in the core area 16, and the deeper source/drain junctions 84/86 in HV area 18 compared to source/drain junctions 80/82 in core area 14.

FIG. 17 illustrates a first set of non-limiting exemplary operational voltages for the memory cells in the memory area 14 for the erase, program and read operations, for selected (sel) and unselected (uns) lines (where selected means the target cell(s) are connected to the indicated line). The erase operation involves removing electrons from the floating gate 34. For the erase operation, it includes a pre-program step (for all cells already erased to avoid leaky cells), an erase step (in which the high positive voltage on the erase gate 62a causes electrons on the floating gate 34 to tunnel through the intervening insulation and onto the erase gate 62a), and a soft program step (for all cells that are over-erased). The erase step is preferably implemented by applying the erase voltage in separate pulses. An entire page (row), block, sector or chip is preferably erased at the same time. Between erase pulses, a read operation can be performed on each bit line BL to read the current from the column of memory cells and compare it to a reference current from an erase reference cell. The erase pulses continue until the read current exceeds that of the reference current from the erase reference cell. The soft programming step can also be applied in pulses, separated by read operations. The soft programming pulses continue until the memory cells exhibit a read current that is lower than a reference current from a soft program reference cell.

The program operation involves injecting electrons onto the floating gate 34. For the program operation, a zero voltage is applied to the drain region 74, positive voltages are applied to the source region 54 and erase gate 62a, and a larger positive voltage is applied to the control gate 38. Electrons traveling along the channel region 94 become heated and are injected onto the floating gate 34 by the well-known technique of hot-electron injection. The read operation involves placing positive voltages on the drain region 74, control gate 38 and erase gate 62a, and sensing the level of any current along the channel region 94. If the floating gate 34 is erased of electrons, current will flow along the channel region 94, whereby the erased programming state is sensed. If the floating gate 34 is programmed with electrons, very little or no current will flow along the channel region 94, whereby the programmed state is sensed.

FIG. 18 illustrates a second set of non-limiting exemplary operational voltages for the memory cells in the memory area for the erase, program and read operations. One significant difference in the voltages of FIG. 18 relative to those of FIG. 17 is that a negative voltage is applied to the control gate 38 line during the erase step, which allows for a lower positive voltage on the erase gate 62a during that step.

The present embodiment provides many advantages. The memory cell only has three gates, the floating gate over the entire channel region, the control gate over the floating gate and the erase gate over the source region, with a single erase gate 62a and source region 54 shared between two memory cells. This configuration allows the memory cell to be effectively scaled down in size relative to split gate memory cell configurations. The inclusion of a separate erase gate 62a reduces the voltage needed to erase the memory cell relative to conventional stacked gate memory cell configurations lacking a dedicated erase gate, allowing for smaller and lower operating voltage power supplies. A lower erase voltage is further enabled by using a negative voltage on the control gate 38 during erase. The notch 63 of the erase gate 62a facing the edge 34a of the floating gate 34 enhances tunneling efficiency there between. A shallower substrate well region than used in the prior art is viable because of the lower erase voltage. A single poly layer 62 is used to form the erase gate 62a in the memory area 14, the logic gates 62b in the core area 16, and the logic gates 62c in the HV area 18, reducing the cost and complexity of making the memory device.

It is to be understood that the present invention is not limited to the embodiment(s) described above and illustrated herein. For example, references to the present invention or embodiment(s) herein are not intended to limit the scope of any claim or claim term, but instead merely make reference to one or more features that may be covered by one or more eventual claims. Materials, processes and numerical examples described above are exemplary only, and should not be deemed to limit the claims. Further, not all method steps need be performed in the exact order illustrated or claimed, but rather in any order that allows the proper formation of the memory cells and logic devices as described herein. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device, comprising:
   a semiconductor substrate;
   a first source region and a first drain region formed in the substrate, with a first channel region of the substrate extending there between;
   a floating gate disposed over and insulated from the first channel region, wherein a conductivity of the first channel region is solely controlled by the floating gate;
   a control gate disposed over and insulated from the floating gate;
   an erase gate disposed over and insulated from the source region, wherein the erase gate includes a notch that faces and is insulated from an edge of the floating gate;
   a second source region and a second drain region formed in the substrate, with a second channel region of the substrate extending there between;
   a first logic gate disposed over and insulated from the second channel region, wherein the first logic gate controls a conductivity of the second channel region;

a third source region and a third drain region formed in the substrate, with a third channel region of the substrate extending there between; and a second logic gate disposed over and insulated from the third channel region, wherein the second logic gate controls a conductivity of the third channel region;

wherein:
- the first logic gate is insulated from the second channel region by first insulation having a first thickness,
- the second logic gate is insulated from the third channel region by second insulation having a second thickness greater than the first thickness,
- the third source region extends deeper into the substrate relative to a surface of the substrate than does the second source region, and
- the third drain region extends deeper into the substrate relative to the surface of the substrate than does the second drain region.

2. A memory device, comprising:

a semiconductor substrate;

a first source region formed in the substrate;

first and second drain regions formed in the substrate, wherein a first channel region of the substrate extends between the first drain region and the first source region, and wherein a second channel region of the substrate extends between the second drain region and the first source region;

a first floating gate disposed over and insulated from the first channel region, wherein a conductivity of the first channel region is solely controlled by the first floating gate;

a second floating gate disposed over and insulated from the second channel region, wherein a conductivity of the second channel region is solely controlled by the second floating gate;

a first control gate disposed over and insulated from the first floating gate;

a second control gate disposed over and insulated from the second floating gate;

an erase gate disposed over and insulated from the first source region, wherein the erase gate includes a first notch that faces and is insulated from an edge of the first floating gate and a second notch that faces and is insulated from an edge of the second floating gate;

a second source region and a third drain region formed in the substrate, with a third channel region of the substrate extending there between;

a first logic gate disposed over and insulated from the third channel region, wherein the first logic gate controls a conductivity of the third channel region;

a third source region and a fourth drain region formed in the substrate, with a fourth channel region of the substrate extending there between;

a second logic gate disposed over and insulated from the fourth channel region, wherein the second logic gate controls a conductivity of the fourth channel region;

wherein:
- the first logic gate is insulated from the third channel region by first insulation having a first thickness,
- the second logic gate is insulated from the fourth channel region by second insulation having a second thickness greater than the first thickness,
- the third source region extends deeper into the substrate relative to a surface of the substrate than does the second source region, and
- the fourth drain region extends deeper into the substrate relative to the surface of the substrate than does the third drain region.

3. A method:

forming a first source region and a first drain region in a semiconductor substrate, with a first channel region of the substrate extending there between;

forming a floating gate over and insulated from the first channel region, wherein a conductivity of the first channel region is solely controlled by the floating gate;

forming a control gate over and insulated from the floating gate;

forming an erase gate over and insulated from the source region, wherein the erase gate includes a notch that faces and is insulated from an edge of the floating gate;

forming a second source region and a second drain region in the substrate, with a second channel region of the substrate extending there between;

forming a first logic gate over and insulated from the second channel region, wherein the first logic gate controls a conductivity of the second channel region;

forming a third source region and a third drain region in the substrate, with a third channel region of the substrate extending there between;

forming a second logic gate over and insulated from the third channel region, wherein the second logic gate controls a conductivity of the third channel region;

wherein:
- the first logic gate is insulated from the second channel region by first insulation having a first thickness,
- the second logic gate is insulated from the third channel region by second insulation having a second thickness greater than the first thickness,
- the third source region extends deeper into the substrate relative to a surface of the substrate than does the second source region, and
- the third drain region extends deeper into the substrate relative to the surface of the substrate than does the second drain region.

4. The method of claim 3, wherein the forming of the erase gate, the first logic gate and the second logic gate comprises:

forming a polysilicon layer over the substrate;

etching the polysilicon layer to form separate first, second and third blocks of the polysilicon layer, wherein the first block is the erase gate, the second block is the first logic gate and the third block is the second logic gate.

5. A method, comprising:

forming a first source region in a semiconductor substrate;

forming first and second drain regions in the substrate, wherein a first channel region of the substrate extends between the first drain region and the first source region, and wherein a second channel region of the substrate extends between the second drain region and the first source region;

forming a first floating gate over and insulated from the first channel region, wherein a conductivity of the first channel region is solely controlled by the first floating gate;

forming a second floating gate over and insulated from the second channel region, wherein a conductivity of the second channel region is solely controlled by the second floating gate;

forming a first control gate over and insulated from the first floating gate;

forming a second control gate over and insulated from the second floating gate;

forming an erase gate over and insulated from the first source region, wherein the erase gate includes a first notch that faces and is insulated from an edge of the first floating gate and a second notch that faces and is insulated from an edge of the second floating gate;

forming a second source region and a third drain region in the substrate, with a third channel region of the substrate extending there between;

forming a first logic gate over and insulated from the third channel region, wherein the first logic gate controls a conductivity of the third channel region;

forming a third source region and a fourth drain region in the substrate, with a fourth channel region of the substrate extending there between;

forming a second logic gate over and insulated from the fourth channel region, wherein the second logic gate controls a conductivity of the fourth channel region;

wherein:

the first logic gate is insulated from the third channel region by first insulation having a first thickness, the second logic gate is insulated from the fourth channel region by second insulation having a second thickness greater than the first thickness, the third source region extends deeper into the substrate relative to a surface of the substrate than does the second source region, and the fourth drain region extends deeper into the substrate relative to the surface of the substrate than does the third drain region.

6. The method of claim 5, wherein the forming of the erase gate, the first logic gate and the second logic gate comprises:

forming a polysilicon layer over the substrate;

etching the polysilicon layer to form separate first, second and third blocks of the polysilicon layer, wherein the first block is the erase gate, the second block is the first logic gate and the third block is the second logic gate.

* * * * *